US008300019B2

(12) United States Patent
Elias et al.

(10) Patent No.: US 8,300,019 B2
(45) Date of Patent: Oct. 30, 2012

(54) CAPACITIVE SENSOR COUPLING CORRECTION

(75) Inventors: John G. Elias, Townsend, DE (US); Steve Porter Hotelling, San Jose, CA (US)

(73) Assignee: Apple Inc., Cupertino, CA (US)

(*) Notice: Subject to any disclaimer, the term of this patent is extended or adjusted under 35 U.S.C. 154(b) by 761 days.

(21) Appl. No.: 12/173,730

(22) Filed: Jul. 15, 2008

(65) Prior Publication Data

US 2010/0013800 A1 Jan. 21, 2010

(51) Int. Cl.
G06F 3/041 (2006.01)
G06F 3/044 (2006.01)

(52) U.S. Cl. ............ 345/173; 345/178; 178/18.06

(58) Field of Classification Search .............. None
See application file for complete search history.

(56) References Cited

U.S. PATENT DOCUMENTS

| | | | | |
|---|---|---|---|---|
| 4,678,869 A | * | 7/1987 | Kable | 178/18.05 |
| 5,016,008 A | * | 5/1991 | Gruaz et al. | 341/33 |
| 5,051,545 A | * | 9/1991 | McDermott | 178/18.07 |
| 5,157,227 A | * | 10/1992 | McDermott et al. | 178/18.02 |
| 5,283,559 A | * | 2/1994 | Kalendra et al. | 345/168 |
| 5,305,017 A | * | 4/1994 | Gerpheide | 345/174 |
| 5,483,261 A | | 1/1996 | Yasutake | |
| 5,488,204 A | | 1/1996 | Mead et al. | |
| 5,534,886 A | | 7/1996 | Nomura et al. | |
| 5,668,553 A | * | 9/1997 | Ashe | 341/154 |
| 5,687,088 A | | 11/1997 | Tomita | |
| 5,766,493 A | | 6/1998 | Shin | |
| 5,816,225 A | | 10/1998 | Koch et al. | |
| 5,825,352 A | | 10/1998 | Bisset et al. | |
| 5,835,079 A | | 11/1998 | Shieh | |
| 5,841,411 A | | 11/1998 | Francis | |
| 5,880,411 A | | 3/1999 | Gillespie et al. | |
| 5,940,065 A | * | 8/1999 | Babb et al. | 345/178 |
| 6,188,391 B1 | | 2/2001 | Seely et al. | |
| 6,310,610 B1 | | 10/2001 | Beaton et al. | |
| 6,323,846 B1 | | 11/2001 | Westerman et al. | |

(Continued)

FOREIGN PATENT DOCUMENTS

GB 2 428 306 A 1/2007

(Continued)

OTHER PUBLICATIONS

International Search Report mailed. Sep. 30, 2010, for PCT Patent Application No. PCT/US2009/050427, filed Jul. 13, 2009, three pages.

(Continued)

*Primary Examiner* — Bipin Shalwala
*Assistant Examiner* — Keith Crawley
(74) *Attorney, Agent, or Firm* — Morrison & Foerster LLP

(57) ABSTRACT

Methods and apparatus for normalizing the effects of the changes to the parasitic capacitive coupling that can occur in touch sensor panels so as to reduce or eliminate the appearance of erroneous touch events. In some embodiments, at some time prior to regular device use (e.g. during factory calibration), a conductive sheet is initially positioned so as to entirely cover a touch surface of a touch sensor panel. A set of sensed signals may be determined upon driving the drive lines and sensing the sense lines of the panel. Correctional coefficients may then be calculated based in part upon the difference between a sensed signal and an expected signal. The correctional coefficients may then be stored in the device and used to determine signal corrections for a set of measured signals during normal operation.

42 Claims, 16 Drawing Sheets

U.S. PATENT DOCUMENTS

| | | | |
|---|---|---|---|
| 6,327,011 | B2 | 12/2001 | Kim |
| 6,505,522 | B1 * | 1/2003 | Wilssens .................... 73/862.51 |
| 6,506,983 | B1 * | 1/2003 | Wilson et al. .............. 178/18.01 |
| 6,583,676 | B2 * | 6/2003 | Krah et al. ...................... 331/74 |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,663,607 | B2 * | 2/2010 | Hotelling et al. ............. 345/173 |
| 7,719,367 | B2 * | 5/2010 | Krah .............................. 331/18 |
| 2003/0067451 | A1 * | 4/2003 | Tagg et al. .................... 345/174 |
| 2006/0026521 | A1 | 2/2006 | Hotelling et al. |
| 2006/0028860 | A1 | 2/2006 | Lien et al. |
| 2006/0097991 | A1 | 5/2006 | Hotelling et al. |
| 2006/0187214 | A1 * | 8/2006 | Gillespie et al. ............. 345/173 |
| 2006/0197753 | A1 | 9/2006 | Hotelling |
| 2007/0074913 | A1 * | 4/2007 | Geaghan et al. ........... 178/18.06 |
| 2007/0152980 | A1 * | 7/2007 | Kocienda et al. ............ 345/173 |
| 2007/0257890 | A1 | 11/2007 | Hotelling et al. |
| 2008/0062148 | A1 * | 3/2008 | Hotelling et al. ............ 345/174 |
| 2008/0150909 | A1 * | 6/2008 | North et al. ................... 345/173 |
| 2008/0157882 | A1 * | 7/2008 | Krah .............................. 331/18 |
| 2008/0157893 | A1 * | 7/2008 | Krah ........................ 331/177 R |
| 2008/0158184 | A1 * | 7/2008 | Land et al. .................... 345/173 |
| 2008/0170046 | A1 * | 7/2008 | Rimon et al. ................. 345/174 |
| 2008/0179112 | A1 * | 7/2008 | Qin et al. .................... 178/18.06 |
| 2008/0186274 | A1 * | 8/2008 | Chang et al. ................. 345/156 |
| 2008/0252608 | A1 * | 10/2008 | Geaghan ....................... 345/173 |
| 2008/0278178 | A1 * | 11/2008 | Philipp ......................... 324/662 |
| 2008/0309622 | A1 * | 12/2008 | Krah .............................. 345/173 |
| 2009/0066674 | A1 * | 3/2009 | Maharyta et al. ............. 345/178 |
| 2009/0273584 | A1 * | 11/2009 | Staton et al. .................. 345/178 |
| 2009/0314621 | A1 | 12/2009 | Hotelling |
| 2009/0315851 | A1 * | 12/2009 | Hotelling et al. ............. 345/173 |
| 2010/0060608 | A1 * | 3/2010 | Yousefpor ..................... 345/174 |
| 2011/0063251 | A1 * | 3/2011 | Geaghan et al. .............. 345/174 |

FOREIGN PATENT DOCUMENTS

| | | |
|---|---|---|
| JP | 2000-163031 A | 6/2000 |
| JP | 2002-342033 A | 11/2002 |
| WO | WO-2010/009057 A2 | 1/2010 |
| WO | WO-2010/009057 A3 | 1/2010 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

Couples to Rows

| | 0 | 1 | 2 | 3 | 4 | 5 | 6 |
|---|---|---|---|---|---|---|---|
| 0 | | 1 | 2 | 3 | 4 | 5 | 6 |
| 1 | | | 2 | 3 | 4 | 5 | 6 |
| 2 | | | | 3 | 4 | 5 | 6 |
| 3 | | | | | 4 | 5 | 6 |
| 4 | | | | | | 5 | 6 |
| 5 | | | | | | | 6 |
| 6 | | | | | | | |

*Touching Row* (row labels on left)

Table Interpretation:
Touching Row 0 Produces an Unwanted Signal in Rows 1-6.
Touching Row 6 Does Not Affect the Signal in Any Other Row.

FIG. 2A

Couples to Rows

| | 14 | 13 | 12 | 11 | 10 | 9 | 8 | 7 |
|---|---|---|---|---|---|---|---|---|
| 14 | | 13 | 12 | 11 | 10 | 9 | 8 | 7 |
| 13 | | | 12 | 11 | 10 | 9 | 8 | 7 |
| 12 | | | | 11 | 10 | 9 | 8 | 7 |
| 11 | | | | | 10 | 9 | 8 | 7 |
| 10 | | | | | | 9 | 8 | 7 |
| 9 | | | | | | | 8 | 7 |
| 8 | | | | | | | | 7 |
| 7 | | | | | | | | |

*Touching Row* (row labels on left)

Table Interpretation:
Touching Row 14 Produces an Unwanted Signal in Rows 7-13.
Touching Row 10 Produces an Unwanted Signal in Rows 7-9, But Not in Any Other Row.

FIG. 2B

Couples to Rows

*Touching Row in Column 0*

| 0 | 0 |  | 2 |  | 4 |  | 6 |
|---|---|---|---|---|---|---|---|
| 1 | 0 |  | 2 |  | 4 |  | 6 |
| 2 | 0 |  | 2 |  | 4 |  | 6 |
| 3 | 0 |  | 2 |  | 4 |  | 6 |
| 4 | 0 |  | 2 |  | 4 |  | 6 |
| 5 | 0 |  | 2 |  | 4 |  | 6 |
| 6 | 0 |  | 2 |  | 4 |  | 6 |
| 7 | 0 |  | 2 |  | 4 |  | 6 |
| 8 | 0 |  | 2 |  | 4 |  | 6 |
| 9 | 0 |  | 2 |  | 4 |  | 6 |
| 10 | 0 |  | 2 |  | 4 |  | 6 |
| 11 | 0 |  | 2 |  | 4 |  | 6 |
| 12 | 0 |  | 2 |  | 4 |  | 6 |
| 13 | 0 |  | 2 |  | 4 |  | 6 |
| 14 | 0 |  | 2 |  | 4 |  | 6 |

*Table Interpretation for Sense Column 0:*
*Touching Any Row Along Column 0 Produces an Unwanted Signal in Rows 0, 2, 4, & 6.*

FIG. 7A

Couples to Rows

| | | | | | | | |
|---|---|---|---|---|---|---|---|
| 0 | | 1 | | 3 | | 5 | |
| 1 | | 1 | | 3 | | 5 | |
| 2 | | 1 | | 3 | | 5 | |
| 3 | | 1 | | 3 | | 5 | |
| 4 | | 1 | | 3 | | 5 | |
| 5 | | 1 | | 3 | | 5 | |
| 6 | | 1 | | 3 | | 5 | |
| 7 | | 1 | | 3 | | 5 | |
| 8 | | 1 | | 3 | | 5 | |
| 9 | | 1 | | 3 | | 5 | |
| 10 | | 1 | | 3 | | 5 | |
| 11 | | 1 | | 3 | | 5 | |
| 12 | | 1 | | 3 | | 5 | |
| 13 | | 1 | | 3 | | 5 | |
| 14 | | 1 | | 3 | | 5 | |

*Touching Row in Column 9*

*Table Interpretation for Sense Column 9:*
*Touching Any Row Along Column 9 Produces an Unwanted Signal in Rows 1, 3, & 5.*

FIG. 7B

CAPACITIVE SENSOR COUPLING CORRECTION

FIELD OF THE INVENTION

The present invention relates generally to the field of touch sensor panels. More particularly, the present invention is directed in one exemplary aspect to correcting spurious signals generated by changes to parasitic capacitive coupling as a result of a touch event.

BACKGROUND OF THE INVENTION

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Touch sensor panels are typically fabricated by depositing and patterning conductive material into a set of conductive elements upon one or more sides of a transparent substrate. The number of sides used in a particular architecture can depend on a variety of factors; however, in many instances, single-sided touch sensor panels are preferred since they are both cheaper to manufacture and require less space.

On a single-sided touch sensor panel, however, conductive routes must share the same side of the substrate. In many cases, this can result in parasitic capacitive coupling as conductive routing used for drive lines runs alongside sense lines on the touch surface. Moreover, when a touch event occurs in a particular region of the touch surface, the touch event can alter the parasitic capacitive coupling and produce spurious signals that can erroneously appear to be touch events in untouched regions of the touch surface.

SUMMARY OF THE INVENTION

Single-sided mutual capacitance touch sensor panels often utilize thin connecting traces in the main area of the touch sensor panel and metal traces in the border areas of the touch sensor panel so as to provide the necessary connectivity between otherwise isolated drive structures (e.g. row patches), and between the drive structures and an external connector. However, because these connecting traces and metal traces may run near or alongside sense structures (e.g. sense columns), parasitic capacitive coupling between the connecting traces/metal traces and the sense structures can occur. This parasitic capacitive coupling can be altered as a finger or other object touches down (i.e. a touch event occurs) over a particular row, causing what erroneously appears to be a touch event at a different row.

Various embodiments of the present invention normalize the effects of the changes to the parasitic capacitive coupling that can occur in touch sensor panels in the presence of a touch event so as to reduce or eliminate the appearance of erroneous touch events. In some embodiments, at some time prior to regular device use (e.g. during factory calibration), a conductive sheet is initially positioned so as to entirely cover a touch surface of a touch sensor panel. A set of sensed signals (raw touch data) may be determined upon driving the drive lines and sensing the sense lines of the panel. Correctional coefficients may then be calculated based in part upon the difference between a sensed signal and an expected signal. The correctional coefficients may then be stored in the device and used to determine signal corrections for a set of measured signals during normal operation.

BRIEF DESCRIPTION OF THE DRAWINGS

FIG. 2A is a table illustrating which rows experience changes in parasitic capacitive coupling from connecting traces as a result of a touch in a particular row in a lower zone of the exemplary touch sensor panel of FIG. 1A.

FIG. 2B is a table illustrating which rows experience changes in parasitic capacitive coupling from connecting traces as a result of a touch in a particular row in an upper zone of the exemplary touch sensor panel of FIG. 1A.

FIG. 7A is a table illustrating which rows experience changes in parasitic capacitive coupling from metal traces running alongside a first column of the exemplary touch sensor panel of FIG. 1A as a result of a touch event in a particular row in the first column.

FIG. 7B is a table illustrating which rows experience changes in parasitic capacitive coupling from metal traces running alongside a second column of the exemplary touch sensor panel of FIG. 1A as a result of a touch event in a particular row.

DETAILED DESCRIPTION OF THE PREFERRED EMBODIMENTS

Figure 1A:
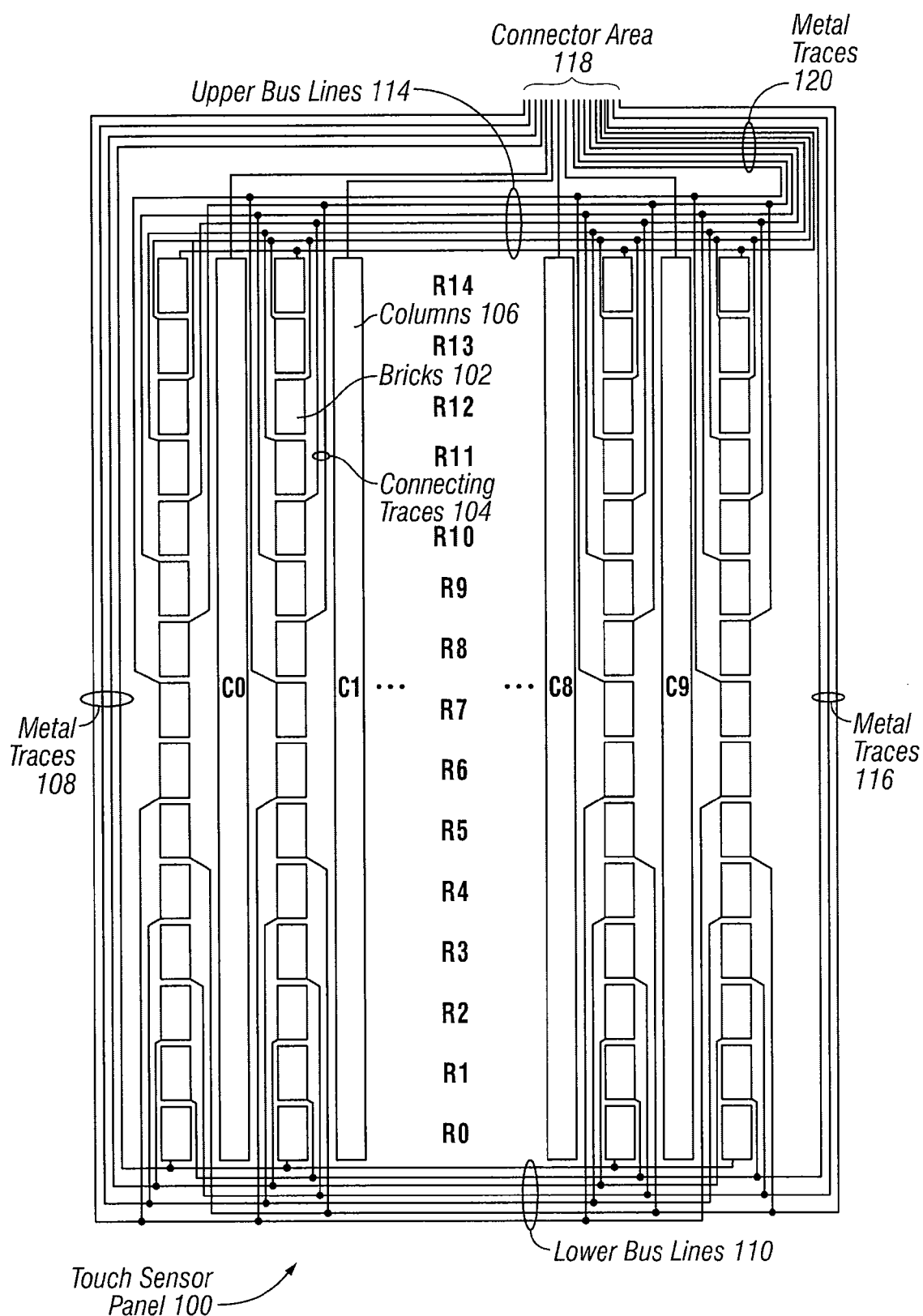
FIG. 1A illustrates an exemplary touch sensor panel including sense (or drive) lines formed as columns, drive (or sense) lines formed as rows of bricks, and connecting traces (illustrated symbolically as thin lines) routed along both sides of the bricks (a so-called "double escape" configuration).

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

Single-sided mutual capacitance touch sensor panels are described in U.S. application Ser. No. 12/110,075 entitled "Brick Layout and Stackup for a Touch Screen" filed on Apr. 25, 2008, the contents of which are incorporated herein by reference in their entirety for all purposes. The single-sided restriction of such touch sensor panels can require the use of thin connecting traces in the main area of the touch sensor panel and metal traces in the border areas of the touch sensor panel to provide the necessary connectivity between otherwise isolated drive structures (e.g. row patches), and between the drive structures and an external connector. However, because these connecting traces and metal traces may run near or alongside sense structures (e.g. sense columns), parasitic capacitive coupling between the connecting traces/metal traces and the sense structures can occur. This parasitic capacitive coupling can be altered as a finger or other object touches down (i.e. a touch event occurs) over a particular row, causing what erroneously appears to be a touch event at a different row.

Various embodiments of the present invention normalize the effects of the changes to the parasitic capacitive coupling that can occur in touch sensor panels in the presence of a touch event so as to reduce or eliminate the appearance of erroneous touch events. In some embodiments, at some time prior to regular device use (e.g. during factory calibration), a conductive sheet is initially positioned so as to entirely cover a touch surface of a touch sensor panel. A set of sensed signals (raw touch data) may be determined upon driving the drive lines and sensing the sense lines of the panel. Correctional coefficients may then be calculated based in part upon the difference between a sensed signal and an expected signal. The correctional coefficients may then be stored in the device and used to determine signal corrections for a set of measured signals during normal operation.

Although embodiments of the invention may be described and illustrated herein in terms of a particular single-sided mutual capacitance touch sensor panel configuration (brick layout), it should be understood that embodiments of this invention are not so limited, but are additionally applicable to other single-sided mutual capacitance touch sensor panel configurations. Note also that as described herein, the drive lines may be associated with rows and the sense lines may be associated with columns, embodiments of the invention are not so limited, but include embodiments in which the sense lines are associated with rows and the drive lines are associated with columns. Additionally, although embodiments of the invention may be described and illustrated in terms of indium tin oxide (ITO) circuits, it should be understood that embodiments of the invention are also applicable to other transparent and non-transparent conductive materials as well. This includes, without limitation, circuits including amorphous silicon, copper indium diselenide, cadmium telluride and/or film crystalline silicon.

As used herein, the term "application" includes without limitation any unit of executable software which implements a specific functionality or theme. The unit of executable software may run in a predetermined environment; for example, a downloadable Java Xlet™ that runs within the JavaTV™ environment.

As used herein, the terms "computer program" and "software" include without limitation any sequence of human or machine cognizable steps that are adapted to be processed by a computer. Such may be rendered in any programming language or environment including, for example, C/C++, Fortran, COBOL, PASCAL, Perl, Prolog, Python, MATLAB, assembly language, scripting languages, markup languages (e.g., HTML, SGML, XML, VoXML), functional languages (e.g., APL, Erlang, Haskell, Lisp, ML, F# and Scheme), as well as object-oriented environments such as the Common Object Request Broker Architecture (CORBA), Java™ (including J2ME, Java Beans, etc.).

As used herein, the term "display" includes any type of device adapted to display information, including without limitation cathode ray tube displays (CRTs), liquid crystal displays (LCDs), thin film transistor displays (TFTs), digital light processor displays (DLPs), plasma displays, light emitting diodes (LEDs) or diode arrays, incandescent devices, and fluorescent devices. Display devices also include less dynamic devices such as printers, e-ink devices, and other similar structures.

As used herein, the term "memory" includes any type of integrated circuit or other storage device adapted for storing digital data including, without limitation, ROM, PROM, EEPROM, DRAM, SDRAM, DDR/2 SDRAM, EDO/FPMS, RLDRAM, SRAM, "flash" memory (e.g., NAND/NOR), and PSRAM.

As used herein, the term "module" refers to any type of software, firmware, hardware, or combination thereof that is designed to perform a desired function.

As used herein, the term "network" refers generally to any type of telecommunications or data network including, without limitation, cable networks, satellite networks, optical networks, cellular networks, and bus networks (including MANs, WANs, LANs, WLANs, internets, and intranets). Such networks or portions thereof may utilize any one or more different topologies (e.g., ring, bus, star, loop, etc.), transmission media (e.g., wired/RF cable, RF wireless, millimeter wave, hybrid fiber coaxial, etc.) and/or communications or networking protocols (e.g., SONET, DOCSIS, IEEE Std. 802.3, ATM, X.25, Frame Relay, 3GPP, 3GPP2, WAP, SIP, UDP, FTP, RTP/RTCP, TCP/IP, H.323, etc.).

As used herein, the terms "processor," "microprocessor," and "digital processor" include all types of digital processing devices including, without limitation, digital signal processors (DSPs), reduced instruction set computers (RISC), general-purpose (CISC) processors, microprocessors, gate arrays (e.g., FPGAs), programmable logic devices (PLDs), reconfigurable compute fabrics (RCFs), array processors, and application-specific integrated circuits (ASICs). Such processors may be contained on a single unitary IC die or distributed across multiple components.

As used herein, the term "wireless" refers to any wireless signal, data, communication, or other interface including, without limitation, Wi-Fi, Bluetooth, 3G, HSDPA/HSUPA, TDMA, CDMA (e.g., IS-95A, WCDMA, etc.), FHSS, DSSS, GSM, PAN/802.15, WiMAX (802.16), 802.20, narrowband/FDMA, OFDM, PCS/DCS, analog cellular, CDPD, satellite systems, millimeter wave or microwave systems, acoustic, and infrared (i.e., IrDA).

Many conventional touch sensor panels are fabricated as a plurality of drive lines and a plurality of sense lines arranged into a plurality of rows and columns (or other similar orientations). In single-layer embodiments, each drive line may be formed from a plurality of conductive elements (e.g. drive electrodes, patches or bricks) connected by connecting traces, while each sense line may be formed as a continuous conductive element (e.g. a sense column). A mutual capacitance touch sensor or pixel is formed wherever a drive brick is located near or adjacent to a sense column. Changes in the amount of charge coupled onto the sense line from the drive line (when stimulated) at each pixel can be detected by a charge or sense amplifier as touch data for that pixel. The image of touch obtained from the combined touch data for each pixel in the touch sensor panel can enable one or more centroids to be calculated. Each centroid is adapted to indicate a precise region of contact upon the touch surface, thus facilitating input detection.

If an input mechanism (e.g., a finger, stylus, or other such input device) is not presently contacting the touch surface, each pixel will typically generate substantially uniform signals, indicating a no-touch condition.

However, if an input mechanism comes in contact with the touch surface, the signal sensed from a particular pixel will be modulated by some amount. Typically, the amount that a signal is modulated depends upon the amount of charge that is shunted to ground as a result of the input mechanism contacting the touch surface. By analyzing the amount of modulation across various pixels of the touch sensor panel, a centroid can be calculated based upon the signal footprint.

FIG. 1A illustrates exemplary touch sensor panel 100 including sense lines (C0-C9) formed as columns 106, drive lines (R0-R14) formed as rows of bricks 102, and connecting traces 104 (illustrated symbolically as thin lines) routed along both sides of the bricks (a so-called "double escape" configuration). It should be understood that FIG. 1A is not drawn to scale, especially in the horizontal (x) dimension. Although a touch sensor panel 100 having 10 columns and 15 rows is shown, it should be understood that any number of columns and rows can be employed. Columns 106 and bricks 102 of FIG. 1A can be formed in a co-planar single layer of conductive material such as Indium Tin Oxide (ITO).

To couple bricks 102 in a particular row together, connecting traces 104, which are also formed from a conductive material, can be routed from the bricks along alternating sides of the bricks in a double escape configuration to a particular lower bus line 110 or upper bus line 114 (although it should be understood that in other embodiments, only a single group of bus lines at either the top or bottom may be employed). Lower bus lines 110 can be routed along the border areas to connector area 118 using metal traces 108 (e.g., for rows R0, R2, R4 and R6) and 116 (for rows R1, R3 and R5). Upper bus lines 114 can also be routed along the border areas to connector area 118 using metal traces 120.

Figure 1B:
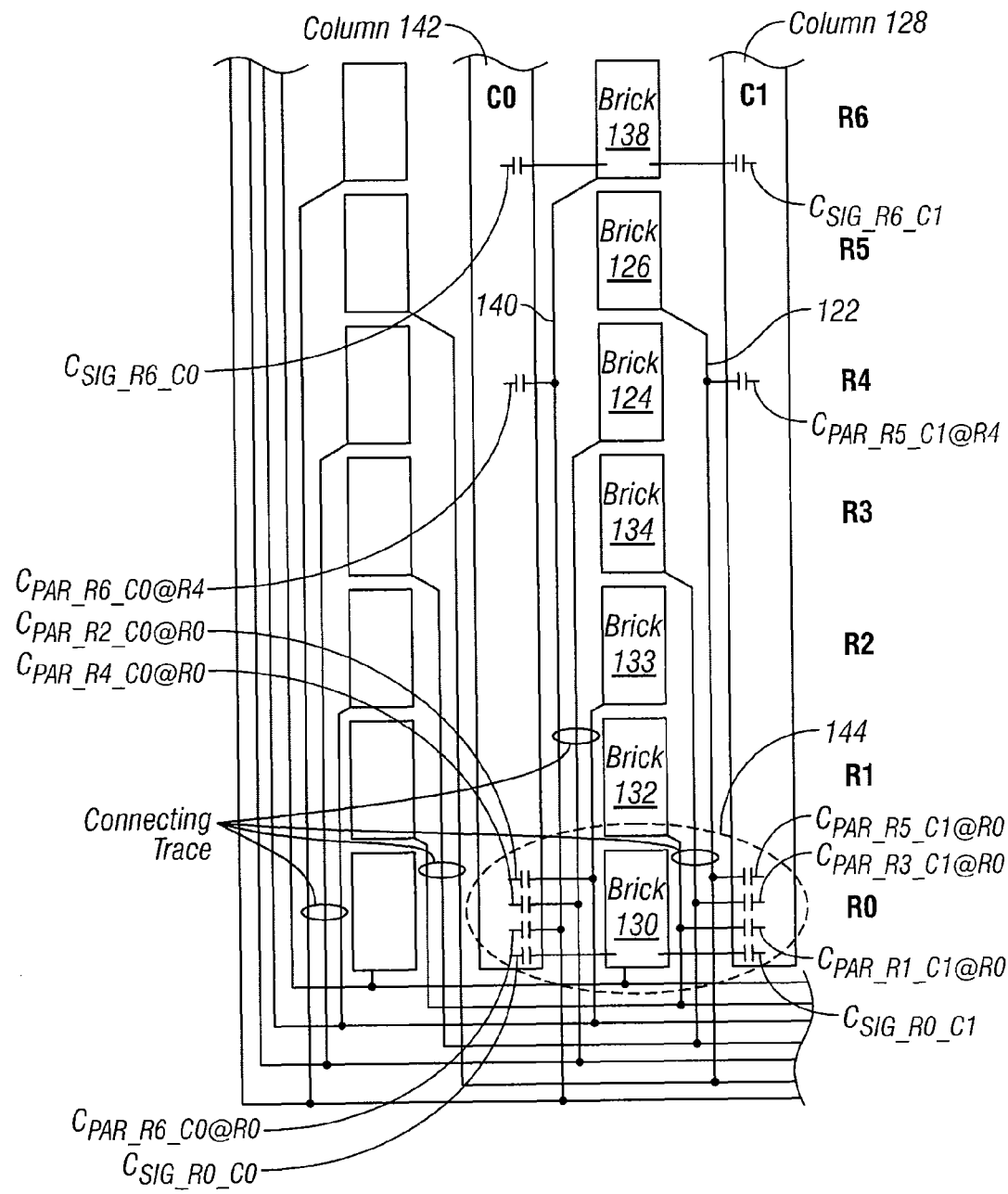
FIG. 1B illustrates a portion of the exemplary touch sensor panel of FIG. 1A and the mutual and parasitic capacitive coupling that can occur between the bricks and connecting traces and the sense columns.

FIG. 1B illustrates a portion of the exemplary touch sensor panel 100 of FIG. 1A, and the mutual and parasitic capacitive coupling that can occur between the bricks and connecting traces and the sense columns. It should be understood that FIG. 1B is also not drawn to scale, especially in the horizontal (x) dimension. For example, in FIG. 1B, the mutual capacitance for the pixel formed at R0 is the combined mutual capacitance between R0 and C0 ($C_{SIG\_R0\_C0}$) and between R0 and C1 ($C_{SIG\_R0\_C1}$), and the mutual capacitance for the pixel formed at R6 is the combined mutual capacitance between R6 and C0 ($C_{SIG\_R6\_C0}$) and between R6 and C1 ($C_{SIG\_R6\_C1}$).

In the single-sided touch sensor panel of FIG. 1B, the connecting traces that connect the multiple bricks in each row must pass near or alongside the sense columns. The proximity of these connecting traces to the sense columns results in the parasitic capacitive coupling described above. For example, because brick 124 (in row R4) has connecting traces 122 and 140 for bricks 126 and 138 (in rows R5 and R6), respectively, passing next to it, parasitic capacitances of $C_{PAR\_R5\_C1@R4}$ (indicating the parasitic mutual capacitance between R5 and C1 occurring at R4) and $C_{PAR\_R6\_C0@R4}$ (indicating the parasitic mutual capacitance between R6 and C0 occurring at R4) can appear between connecting traces 122 and 140 and sense columns 128 and 142, respectively. Similarly, because brick 130 has the connecting traces for bricks 132, 133, 134, 124, 126 and 138 passing next to it, parasitic capacitances of $C_{PAR\_R1\_C1@R0}$, $C_{PAR\_R2\_C0@R0}$, $C_{PAR\_R3\_C1@R0}$, $C_{PAR\_R4\_C0@R0}$, $C_{PAR\_R5\_C1@R0}$ and $C_{PAR\_R6\_C0@R0}$, respectively, can appear between the connecting traces and the sense columns C1 and C0.

It should be understood that it may not be sufficient to simply provide sufficient space between connection traces to minimize the parasitic mutual capacitive coupling. In many cases, there must be a sufficient number of drive and sense electrodes within the panel so that the capacitive elements are able to detect contact in all regions of the touch surface. Therefore, spacing the sensors and the routing so as to avoid parasitic capacitive coupling will often yield regions of the touch surface where touch input may not be detectable.

This parasitic capacitive coupling can cause a variety of problems for the input determination process of the touch sensor panel. For example, contact can be falsely detected in one or more untouched rows if a finger touching down over one row blocks and therefore reduces some of the nearby parasitic capacitive coupling associated with the untouched row caused by a connecting trace or metal border trace for the untouched row. In many cases, this parasitic capacitive coupling causes false areas of apparent touch that adversely affect centroid calculation, often resulting in larger centroids, shifted centroids, or in some cases, extra centroids (as possible in certain multi-touch applications). In the example of FIG. 1B, a finger touching down over brick 130 (see reference character 144) may not only reduce the mutual capacitance of that pixel, $C_{SIG\_R0\_C1}$, but can also reduce the nearby parasitic capacitances $C_{PAR\_R1\_C1@R0}$, $C_{PAR\_R2\_C0@R0}$, $C_{PAR\_R3\_C1@R0}$, $C_{PAR\_R4\_C0@R0}$, $C_{PAR\_R5\_C1@R0}$ and $C_{PAR\_R6\_C0@R0}$. The effect of the reduction of the parasitic capacitances is that a small amount of touch will be erroneously detected over bricks 132, 133, 134, 124, 126 and 138.

For example, in an application utilizing a touch screen keyboard, placing a finger upon the surface region corresponding to the letter "M" may cause a "K" to be additionally generated. Various embodiments of the present invention therefore compensate for changes in touch data resulting from changes to parasitic capacitive coupling, thereby preventing false inputs (touches) from being detected.

Note that for the purposes of the following discussion, the exemplary touch sensor panel layout of FIG. 1A will be utilized for purposes of illustration only. The exemplary layout includes fifteen rows and ten columns, where the rows are labeled 0-14 starting from the bottom of the touch sensor panel, and the columns are labeled 0-9 starting from the left side of the panel. Additionally, the rows are divided into two zones, with rows 0-6 including a lower zone with connecting traces directed towards the bottom of the panel, while rows 7-14 include an upper zone with connecting traces directed towards to top of the panel. Note, however, that this is merely for the purposes of illustration; as mentioned above, the present invention is not limited to this particular layout or any one particular layout. Any number of rows, columns, zones, and/or sense and drive configurations are possible according to embodiments of the present invention. Additionally, various embodiments of the present invention include configurations where the drive and sense lines may not be arranged into rows and columns (including layouts with staggered, offset, or asymmetrical arrangements, and/or unevenly sized electrodes).

FIG. 2A is a table illustrating which rows experience changes in parasitic capacitive coupling from connecting traces as a result of a touch in a particular row in a lower zone of the exemplary touch sensor panel of FIG. 1A. As shown by the figure, a touch event over row 0 affects the most number of rows (rows 1-6) because the connecting traces for rows 1-6 pass near or adjacent to the touch region serviced by row 0, and therefore the parasitic capacitive coupling from the connecting traces for rows 1-6 to the nearby sense column is likely to be affected by the touch event. Thus, if a finger was placed upon row 0 when row 5 was driven, and if the finger blocked some of the parasitic capacitance from the connecting trace for row 5 to the nearby sense column located near row 0, an unwanted signal indicative of a small phantom touch event would be generated indicating contact at row 5.

Note that a touch event over row 6 does not affect any other row because there are no connecting traces passing near or adjacent to the touch region serviced by row 6.

FIG. 2B is a table illustrating which rows experience changes in parasitic capacitive coupling from connecting traces as a result of a touch in a particular row in an upper zone of the exemplary touch sensor panel of FIG. 1A. In this figure, a touch event over row 7 affects the least number of rows (none), while touches over row 14 affects the most number of rows (rows 7-13). Touches over the row with the largest row value affect the most number of rows in FIG. 2B (in contrast to FIG. 2A, when it affects the least number of rows) because the direction of connecting trace routing is different in each zone. In the lower zone, all connecting traces run toward the bottom of the touch sensor panel, each passing near or adjacent to the touch region serviced by row 0. In the upper zone, all connecting traces run toward the top of the touch panel, each passing near or adjacent to the region serviced by row 14. In many cases, the more rows a connecting trace passes, the greater the potential for the parasitic coupling of that connecting trace to be affected by a touch.

Figure 3:
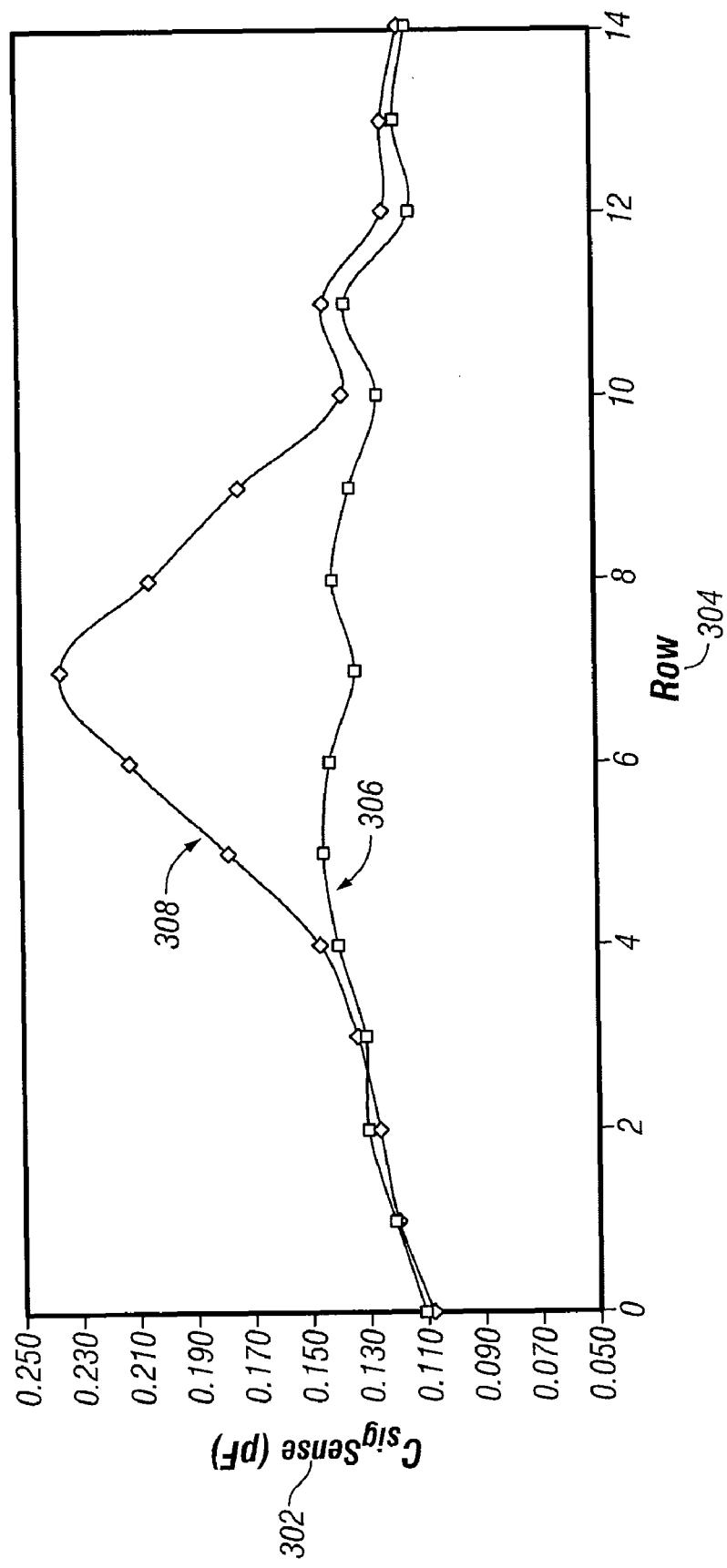
FIG. 3 is a graph illustrating the relative effects of altering the parasitic capacitive coupling from connecting traces for rows in a particular column of the exemplary touch sensor panel of FIG. 1A according to one embodiment of the present invention.

FIG. 3 is a graph illustrating the relative effects of altering the parasitic capacitive coupling from connecting traces for rows in a particular column of the exemplary touch sensor panel of FIG. 1A according to one embodiment of the present invention. While FIG. 3 illustrates the results associated with a particular column of the touch sensor panel (i.e., column 5 of the layout described above), note that the data from other columns may be generated in a manner similar to that described below.

A first plot 306 depicts a set of sense values (changes in the mutual capacitance, Csig_sense, measured in Pico-farads (pF)) taken from a single finger sequentially contacting each row of the touch sensor panel along a given column. Notice that while slight variations exist between each of the recorded sense values (as might be caused by secondary factors, differences in sense amplifiers, etc.), the shape of the plot 306 is substantially flat.

A second plot 308 depicts a set of sense values taken when a conductive rubber sheet completely covers the touch surface, simulating a touch event at every row along a given column. The sense values taken from the second plot 308 depict raw values of the touch signal measured at each row, where the conductive sheet causes the capacitance of the sensed signal to change due to the change in the parasitic capacitance for each row. As evidenced by the figure, row 7 exhibits the highest amount of capacitive change since its drive route passes more rows than any other drive route. Because each row is being touched by the conductive rubber sheet, the parasitic capacitance of the connecting trace for row 7 is affected (reduced) all along the connecting trace as it passes through rows 8-14, resulting in a large capacitive change for row 7. In contrast, the parasitic capacitance of the connecting trace for row 13 is affected (reduced) only as it passes through row 14, resulting in a small capacitive change for row 13.

The difference between a sense value in plot 308 and a corresponding sense value in plot 306 for a particular row thus yields an approximation of the amount that a signal has been modulated as a result of changes to the parasitic capacitive coupling for that row. For example, in row 7, this value might correspond to approximately 0.103 pF (0.235 pF-0.132 pF). Note, however, that the added capacitance 0.103 pF is a result of changes to the parasitic capacitive coupling along each of the rows servicing touch regions through which the connecting trace of row 7 passes. Thus, a portion of the change in the mutual capacitance is attributable to changes in the parasitic capacitive coupling with respect to row 8, a portion is attributable to row 9, a portion to row 10, etc., including all rows servicing touch regions through which the connecting trace for row 7 passes.

Notice also that the amount of capacitance contributed by each row may not always be identical. For example, in plot 308, the slope is smaller between rows 3 and 4 than the slope between rows 4 and 5. This indicates that the amount of capacitance contributed by row 4 may be greater than the amount of capacitance contributed by row 3. Furthermore, the amount attributable to capacitive coupling will depend in part upon the particular layout used. In other words, the shape of plot 308 can vary across embodiments.

The above observations may be thus be used to formulate an expression for generating a corrected signal from an input measured signal. In some embodiments, the expression is given as such:

$$Rc_{kj} = R_{kj} - \sum_{i=0}^{i=k-1} C_{ij} R_{ij}$$

In the above expression, j is the selected sense column, $Rc_{kj}$ is the corrected row signal, $R_{kj}$ is the measured row signal at row k, and each term of the summation is the amount of capacitance attributable to a particular row servicing a touch region through which the connecting trace of row k passes. More particularly, $R_{ij}$ is the signal measured at each row i, while $C_{ij}$ is a correctional coefficient associated with row i.

The above expression enables a corrected row signal to be calculated based upon an input set of measured signals and an input set of correctional coefficients. However, since the correctional coefficients are initially unknown, these values must first be calculated. Note that in several embodiments, the correctional coefficients may be calculated and programmed into the touch sensor panel before initial operation.

Figure 4:
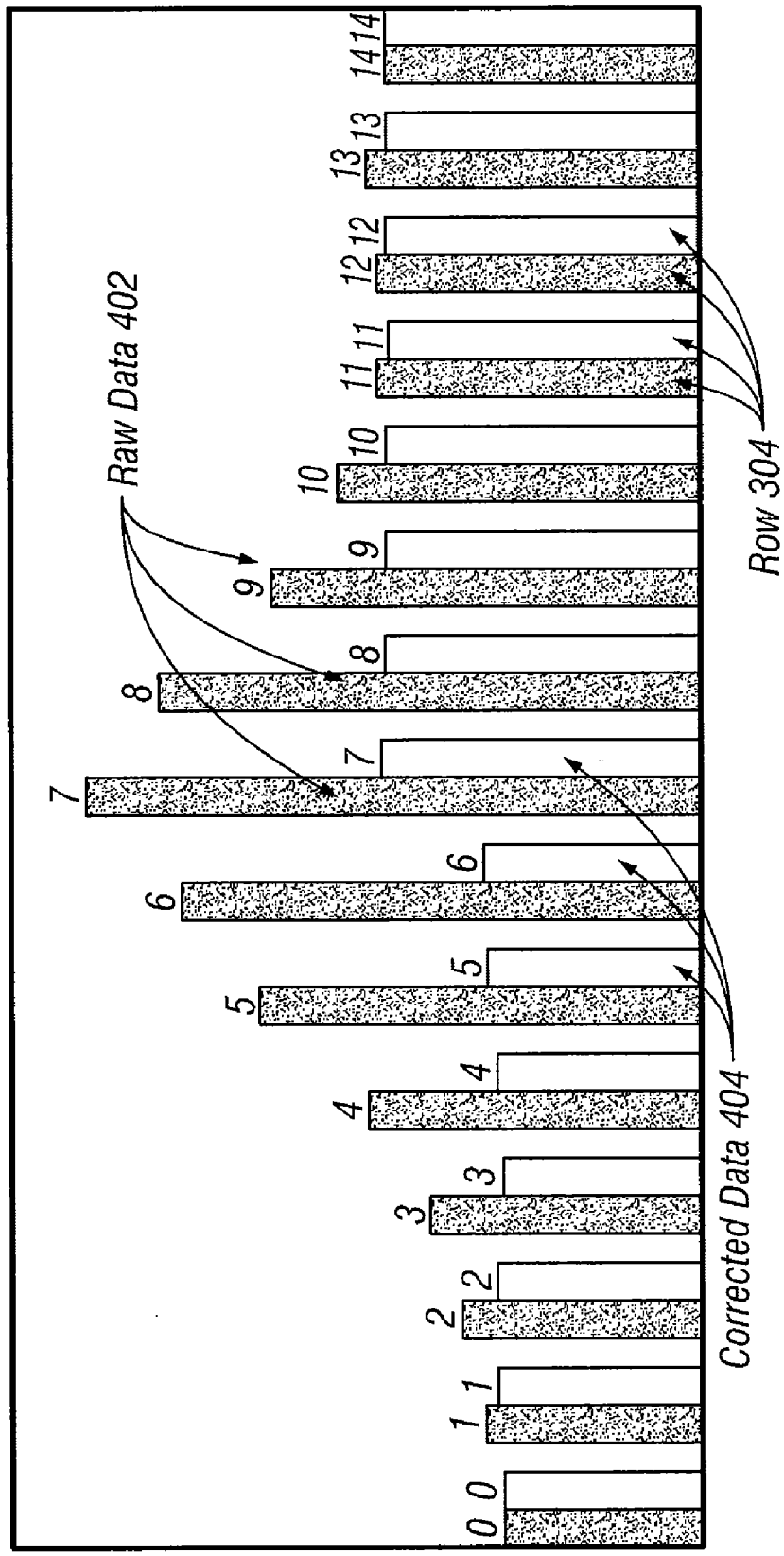
FIG. 4 is a bar chart illustrating an exemplary method of determining correctional coefficients by equalizing touch signals across rows to obtain corrected data for rows in a particular column of the exemplary touch sensor panel of FIG. 1A according to one embodiment of the present invention.

FIG. 4 is a bar chart illustrating an exemplary method of determining correctional coefficients by equalizing touch signals across rows to obtain corrected data for rows in a particular column of the exemplary touch sensor panel of FIG. 1A according to one embodiment of the present invention. As shown by FIG. 4, data is arranged into pairs of bars such that the number above each bar represents a particular row 304 in the touch sensor panel. Within each pair, the bar on the left represents raw data 402 indicating a mutual capacitance measured at a corresponding row 304 in response to the conductive sheet completely covering the touch surface. The bar on the right represents corrected data 404 indicating an estimate of the mutual capacitance expected at the corresponding row 304 in the absence of changes to the parasitic capacitive coupling for that row. In some embodiments, the corrected data 404 for each row in a particular zone is assumed to be equalized to the mutual capacitance associated with a row having the shortest connecting traces among all other rows that zone. For example, in FIG. 4, the corrected data 404 for the lower zone is assumed to be the raw data 402 yielded by row 0, while the corrected data 404 for the upper zone is assumed to be the raw data 402 yielded by row 14. In some embodiments, equalizing touch signals across rows facilitates the calculation of correctional coefficients. Note, however, that other methods of estimating the corrected data 404 for each row are possible in accordance with embodiments of the present invention.

Once the expected corrected data 404 for each row has been calculated, a set of equations may then be used to solve for each respective correctional coefficient. In some embodiments, the set of equations may be generated from the aforementioned expression:

$$Rc_{kj} = R_{kj} - \sum_{i=0}^{i=k-1} C_{ij} R_{ij}$$

For example, in the lower zone, this yields the following set of equations for a particular column j:

$Rc_0 = R_0$ (1)

$Rc_1 = R_1 - C_0 R_0$ (2)

$Rc_2 = R_2 - C_1 R_1 - C_0 R_0$ (3)

$Rc_3 = R_3 - C_2 R_2 - C_1 R_1 - C_0 R_0$ (4)

$Rc_4 = R_4 - C_3 R_3 - C_2 R_2 - C_1 R_1 - C_0 R_0$ (5)

$Rc_5 = R_5 - C_4 R_4 - C_3 R_3 - C_2 R_2 - C_1 R_1 - C_0 R_0$ (6)

$Rc_6 = R_6 - C_5 R_5 - C_4 R_4 - C_3 R_3 - C_2 R_2 - C_1 R_1 - C_0 R_0$ (7)

Likewise, in the upper zone, these equations are yielded for a particular column j:

$Rc_{14} = R_{14}$ (8)

$Rc_{13} = R_{13} - C_{14} R_{14}$ (9)

$Rc_{12} = R_{12} - C_{14} R_{14} - C_{13} R_{13}$ (10)

$Rc_{11} = R_{11} - C_{14} R_{14} - C_{13} R_{13} - C_{12} R_{12}$ (11)

$Rc_{10} = R_{10} - C_{14} R_{14} - C_{13} R_{13} - C_{12} R_{12} - C_{11} R_{11}$ (12)

$Rc_9 = R_9 - C_{14} R_{14} - C_{13} R_{13} - C_{12} R_{12} - C_{11} R_{11} - C_{10} R_{10}$ (13)

$Rc_8 = R_8 - C_{14} R_{14} - C_{13} R_{13} - C_{12} R_{12} - C_{11} R_{11} - C_{10} R_{10} - C_9 R_9$ (14)

$Rc_7 = R_7 - C_{14} R_{14} - C_{13} R_{13} - C_{12} R_{12} - C_{11} R_{11} - C_{10} R_{10} - C_9 R_9 - C_8 R_8$ (15)

It is worth noting, however, that the indices of the summation may require appropriate adjustment based upon the architectural layout and the particular direction of routing. In the present case, this can be accomplished, for example, by starting the summation at row 14 (i=14) and decrementing until reaching a row having a value that is one greater than the value of row k (i=k+1).

With respect to the above set of equations, each value $R_i$ corresponds to the raw data 402 at a particular row i. Likewise, each value $Rc_k$ corresponds to the corrected data 404, which in some embodiments, may be assumed to be equal to the raw data 342 from the row having the shortest ITO route among all other rows that zone (i.e. rows 0 and 14 as given by equations (1) and (8)). The remaining equations can then be solved for each unknown $C_i$ until all correctional coefficients are determined.

Once the correctional coefficients are determined, the coefficients may then be used to calculate corrected signals from an input set of measured signals. In some embodiments, one or more correction modules may be adapted to provide appropriate corrections for measured signals based upon the calculated correctional coefficients. Note that the correction modules may include any combination of software, firmware, and/or hardware according to embodiments of the present invention.

Figure 5A:
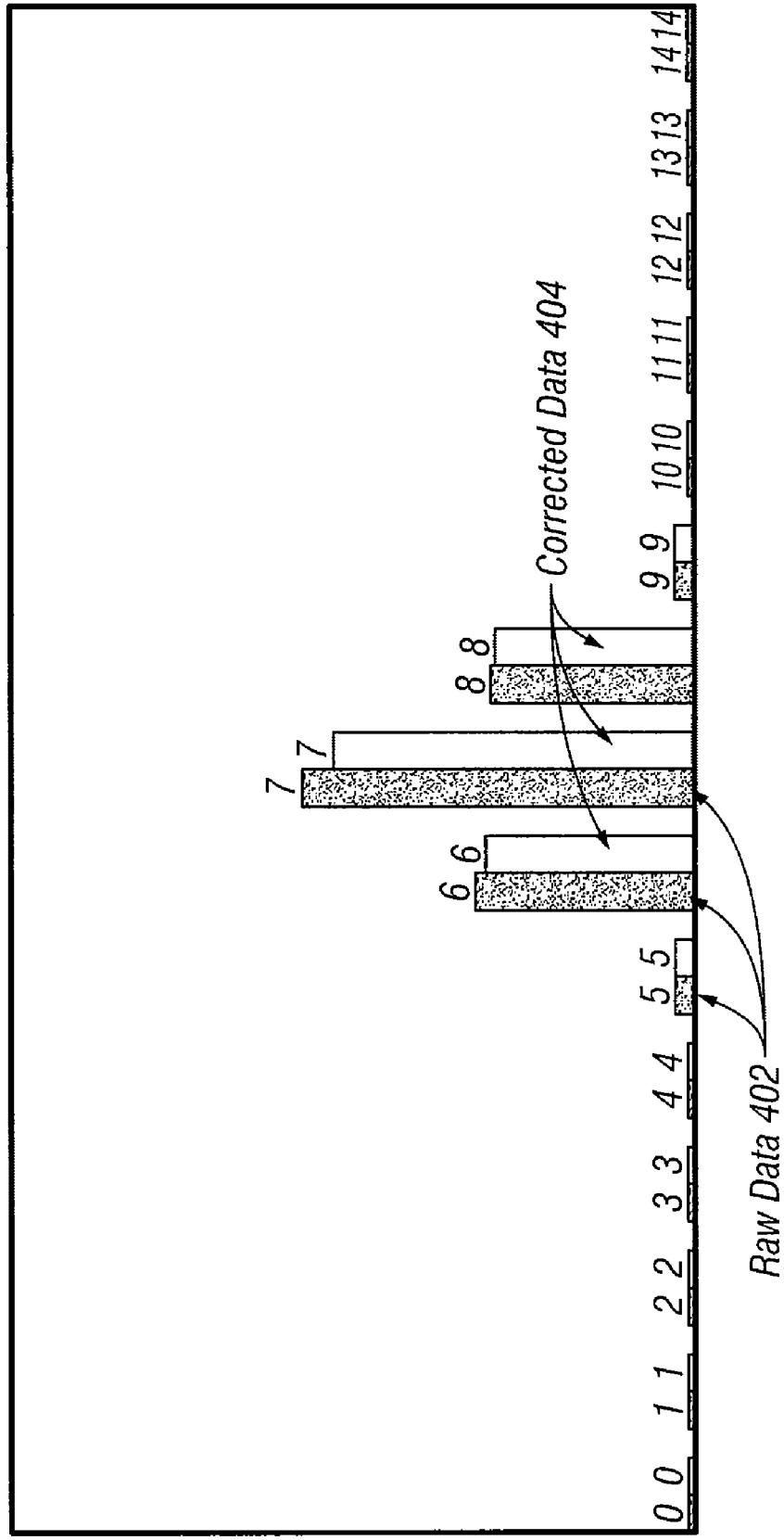
FIG. 5A is a bar chart illustrating exemplary capacitive coupling correction in response to a first contact at a particular row and column of the exemplary touch sensor panel of FIG. 1A according to one embodiment of the present invention.

FIG. 5A is a bar chart illustrating exemplary capacitive coupling correction in response to a first contact at a particular row and column of the exemplary touch sensor panel of FIG. 1A according to one embodiment of the present invention. In FIG. 5A, a single finger is centered at row 7, column 5. In order to correct the signal at row 7, the equation yielding the corrected signal at for this row ($Rc_7$) may be utilized. In some embodiments, this may be given by equation (15) above. Since each correctional coefficient $C_i$ has already been calculated, and the raw data 402 for each row $R_i$ has already been measured, then $Rc_7$ can be determined.

Figure 5B:
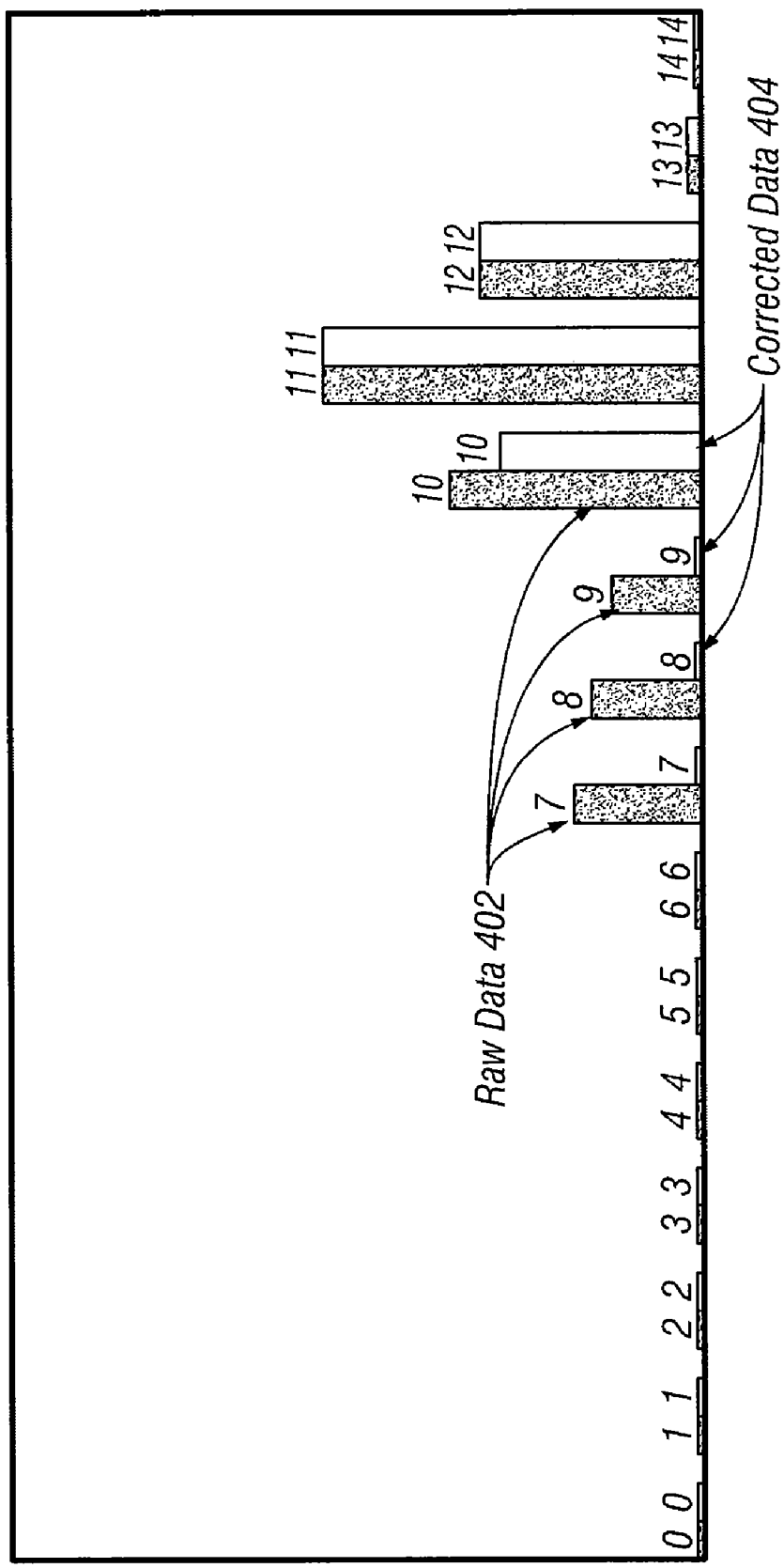
FIG. 5B is a bar chart illustrating exemplary capacitive coupling correction in response to a second contact at a different row and column of the exemplary touch sensor panel of FIG. 1A according to one embodiment of the present invention.

FIG. 5B is a bar chart illustrating exemplary capacitive coupling correction in response to a second contact at a different row and column of the exemplary touch sensor panel of FIG. 1A according to one embodiment of the present invention. In this particular case, the contact is centered at row 11, column 5. Since row 11 affects rows 7-10 (see FIG. 2B), changes to the parasitic capacitive coupling may generate an erroneous indication of touch in each of these rows. In the case of rows 7, 8, and 9, the raw data 302 erroneously indicates that there is contact with these rows. In the case of row 10, the changes to the parasitic capacitive coupling augment the desired signal, potentially shifting the location of a calculated centroid or otherwise enlarging its dimensions.

As in the case of FIG. 5A, the row correction equations mentioned above may be utilized to correct each respective row $Rc_k$ according to various embodiments of the present invention. In this case, rows 7-10 are corrected, but not rows 12 or 13. This comports with the architectural layout, since row 11 affects rows 7-10 but not to rows 12 or 13 (see FIG. 2B and accompanying text).

Apart from changes to the parasitic capacitive coupling associated with ITO portions of a touch circuit, additional changes may also occur due to metal traces passing nearby sense lines (columns) on various sides of the touch surface. The metal traces often provide lower resistivity than the ITO traces, and are typically utilized outside of the visible area of a touch surface because of their non-transparent nature.

For the purposes of the following discussion, an exemplary a touch sensor panel layout as shown in FIG. 1A is described. In this layout, the metal traces 108 for rows 0, 2, 4, and 6 for the lower portion of the panel pass next to sense column 0 across the entire length of the panel, while the metal traces for rows 1, 3, and 5 pass next to sense column 9 across the opposite length of the panel. Note, however, this is merely for the purposes of illustration; in general, the present invention is not limited to this particular layout or any one particular layout. In fact, the metal traces on either side of the panel may connect to any of the sense columns according to embodiments of the present invention. Additionally, the traces may run in any length and/or direction.

Figure 6:
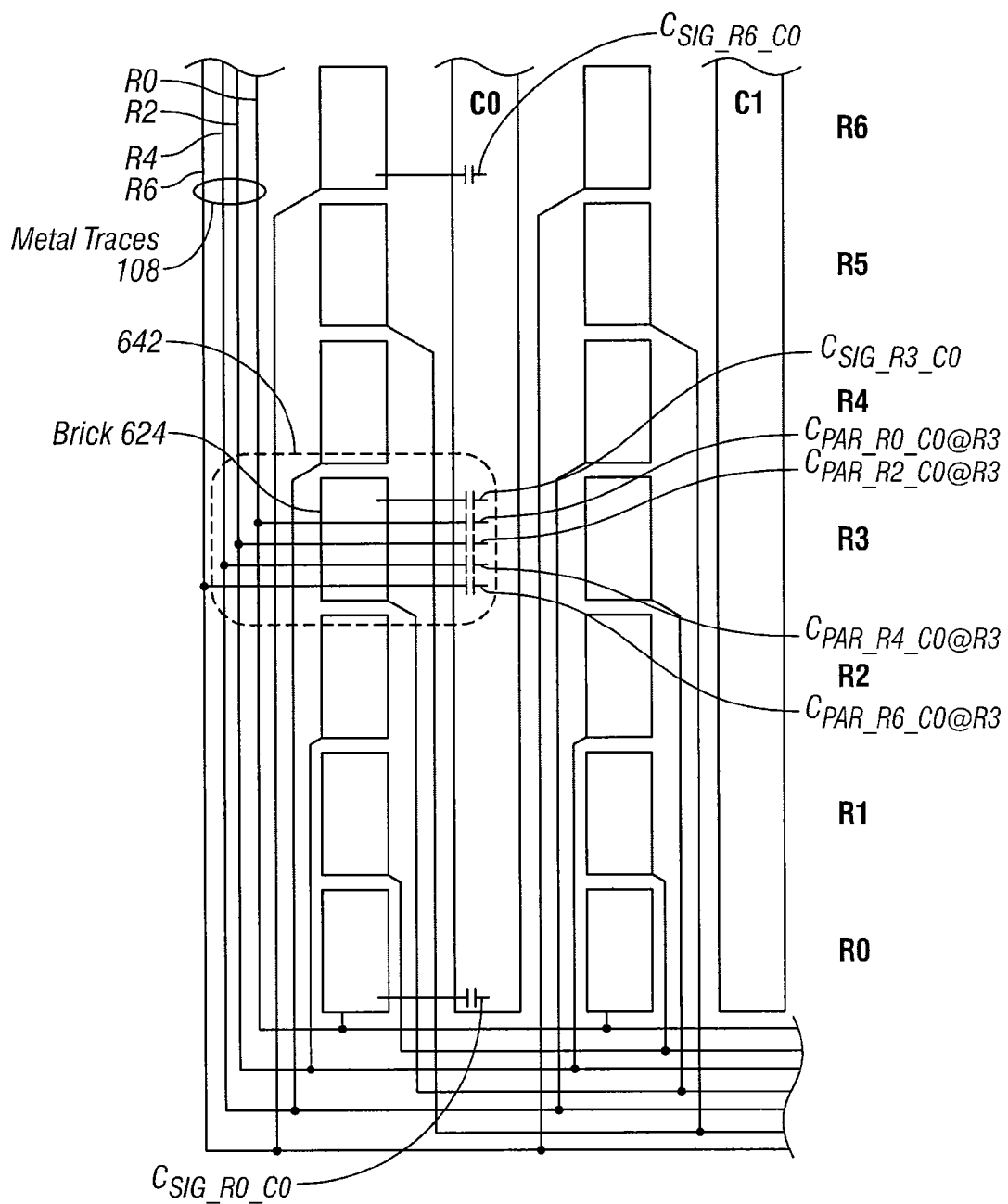
FIG. 6 is a diagram illustrating a portion of the exemplary touch sensor panel of FIG. 1A, and the mutual and parasitic capacitive coupling that can occur between the bricks and metal traces and the sense columns.

FIG. 6 illustrates a portion of the exemplary touch sensor panel 100 of FIG. 1A, and the mutual and parasitic capacitive coupling that can occur between the bricks and metal traces and the sense columns. For example, in FIG. 6, the mutual capacitance for the pixel formed by R0 and C0 is $C_{SIG\_R0\_C0}$, and the mutual capacitance for the pixel formed by R6 and C0 is $C_{SIG\_R6\_C0}$.

In the single-sided touch sensor panel of FIG. 6, the metal traces 108 that connect the multiple bricks in each row R0, R2, R4 and R6 must pass near sense column C0. The proximity of these metal traces 108 to the sense column C0 results in the parasitic capacitive coupling described above. For example, because brick 624 has metal traces 108 for rows R0, R2, R4 and R6 passing nearby, parasitic capacitances of $C_{PAR\_R0\_C0@R3}$, $C_{PAR\_R2\_C0@R3}$, $C_{PAR\_R4\_C0@R3}$, and $C_{PAR\_R6\_C0@R3}$ can appear between metal traces 108 and sense column C0 near the pixel formed by R3 and C0. Similar parasitic capacitances can appear near any of the other pixels formed at the outer edges of the touch sensor panel.

This parasitic capacitive coupling can cause a variety of problems for the input determination process of the touch sensor panel. For example, contact can be falsely detected in an untouched row if a finger touching down over one row blocks and therefore reduces some of the nearby parasitic capacitive coupling associated with the untouched row caused by a metal trace for the untouched row. In some cases, this parasitic capacitive coupling causes false areas of apparent touch that adversely affect centroid calculation, often resulting in larger centroids, shifted centroids, or in some cases, extra centroids (as possible in certain multi-touch applications). In the example of FIG. 6, a finger touching down over the pixel formed by R3 and C0 (see reference character 642) can not only reduce the mutual capacitance of that pixel, $C_{SIG\_R3\_C1}$, but can also reduce the nearby parasitic capacitances $C_{PAR\_R0\_C0@R3}$, $C_{PAR\_R2\_C0@R3}$, $C_{PAR\_R4\_C0@R3}$, and $C_{PAR\_R6\_C0@R3}$. The effect of the reduction of the parasitic capacitances is that a small amount of touch will be erroneously detected at the pixels formed by R0 and C0, R2 and C0, R4 and C0, and R6 and C0.

FIG. 7A is a table illustrating which rows experience changes in parasitic capacitive coupling from metal traces running alongside a first column of the exemplary touch sensor panel of FIG. 1A as a result of a touch event in a particular row in the first column. As stated above, metal traces for rows 0, 2, 4, and 6 pass next to sense column 0 across the entire length of the panel. As FIG. 7A indicates, contact with any row along column 0 produces an unwanted signal change in each of these four rows.

Similarly, FIG. 7B is a table illustrating which rows experience changes in parasitic capacitive coupling from metal traces running alongside a second column of the exemplary touch sensor panel of FIG. 1A as a result of a touch event in a particular row. In this case, the metal traces for rows 1, 3, and 5 pass next to sense column 9 across the opposite length of the panel. Hence, by touching any row along column 9, an unwanted signal may be generated at rows 1, 3, and 5.

The columns affected by metal trace coupling thus exhibit different signal profiles than the columns which are not affected. In some embodiments, plotting signal values corresponding to various columns in the touch sensor panel enables expected signal values for the affected columns to be estimated based upon characteristics of one or more unaffected columns.

Figure 8:
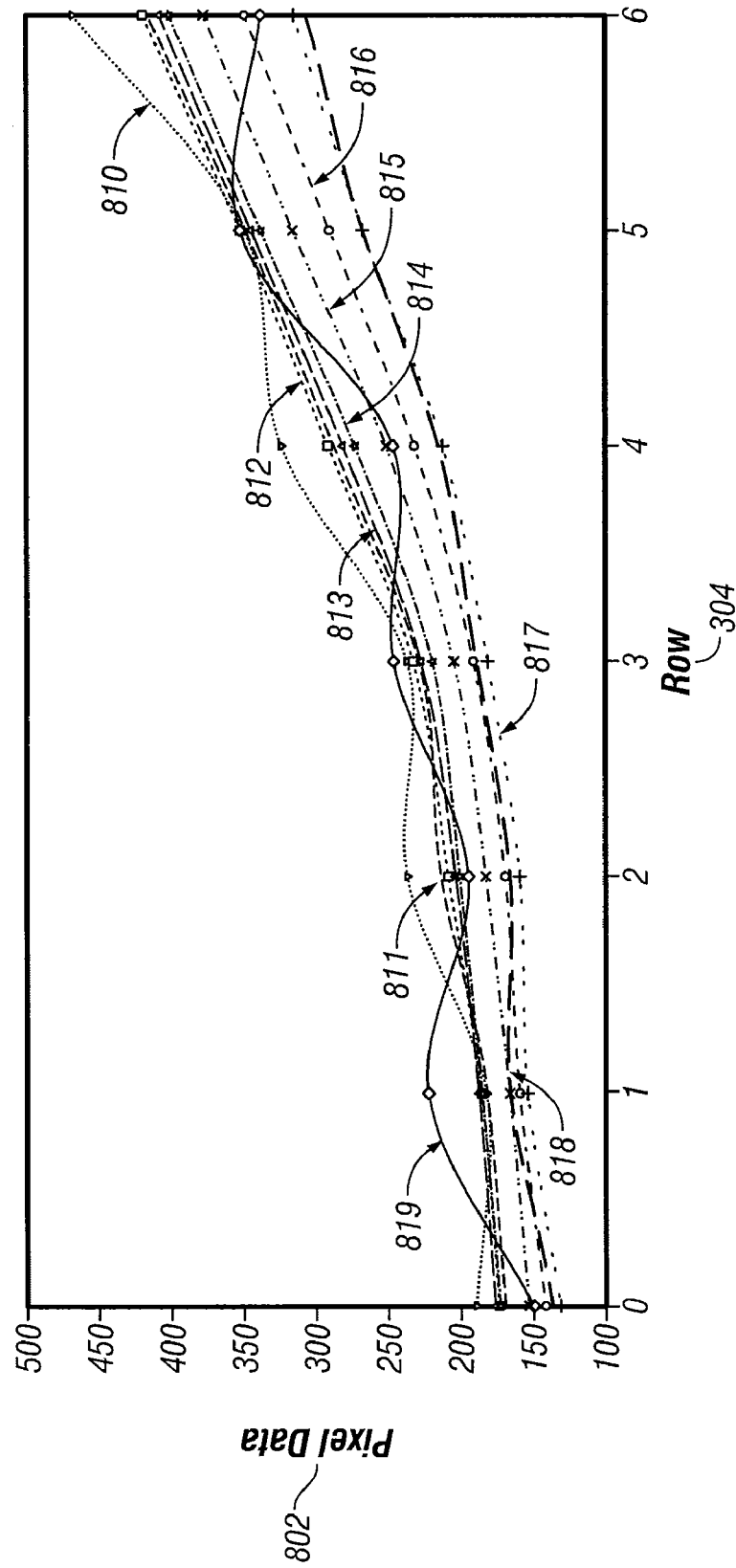
FIG. 8 is a graph illustrating the polynomial shape of exemplary uncorrected pixel data for rows 0-6 associated with all columns in the exemplary touch sensor panel of FIG. 1A.

For example, FIG. 8 is a graph illustrating the polynomial shape of exemplary uncorrected pixel data for rows 0-6 associated with all columns in the exemplary touch sensor panel of FIG. 1A. Notice that the pixel data 802 across rows 304 generally exhibits a second order polynomial trend. As shown by the figure, the pixel data 802 for column 0 (plot 810) and the pixel data 802 for column 9 (plot 819) exhibit different functional characteristics than the pixel data 802 for columns 1-8 (plots 811-818). More specifically, column 0 exhibits spurious high values at rows 0, 2, 4, and 6, while column 9 exhibits spurious high values at rows 1, 3, and 5. As mentioned above, this is a result of the particular touch sensor panel design.

From this data, it is then possible to estimate what the row signals should be in the absence of changes to the parasitic capacitive coupling. Any number of techniques may be used for this process according to embodiments of the present invention. This includes, without limitation, techniques related to polynomial fitting (including the method of least squares, regression analysis, and other such methods), as well as various other interpolative techniques (e.g., linear, polynomial, spline, etc.). Note also that the particular technique employed in a given context may depend in part upon functional characteristics associated with one or more signal profiles.

Figure 9:
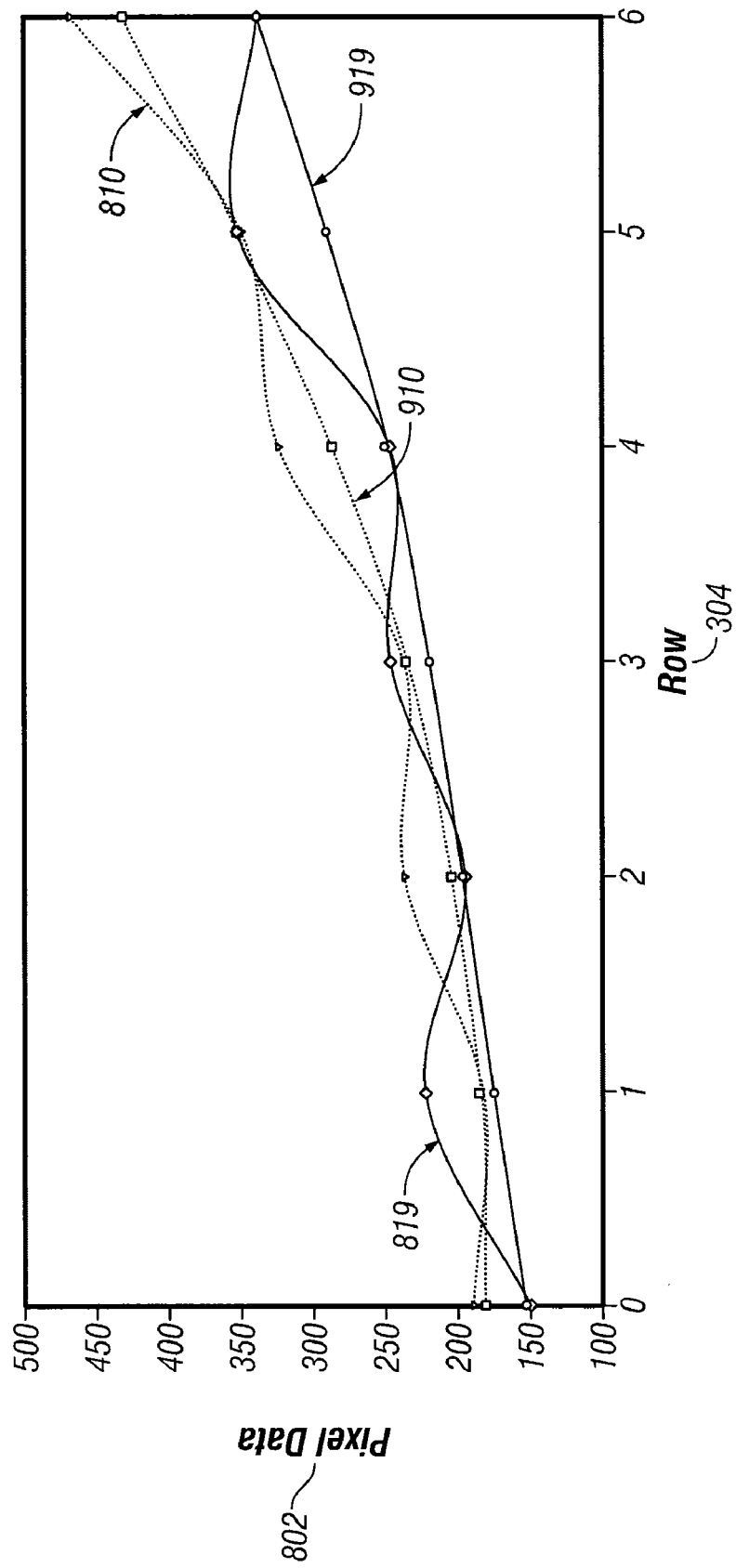
FIG. 9 is a graph illustrating exemplary polynomial fitting of the uncorrected pixel data for rows 0-6 and columns 0 and 9 in the exemplary touch sensor panel of FIG. 1A according to one embodiment of the present invention.

FIG. 9 is a graph illustrating exemplary polynomial fitting of the uncorrected pixel data for rows 0-6 and columns 0 and 9 in the exemplary touch sensor panel of FIG. 1A according to one embodiment of the present invention. For the sake of illustration, the pixel data associated with the columns affected by metal coupling (i.e., columns 0 and 9) is reproduced as plots 810 and 819. As shown by the figure, plot 910 illustrates the best second order fit for plot 810, while plot 919 illustrates the best third order fit for plot 819. These fits may be used to identify the values expected if metal routing were not present in the touch sensor panel.

An expression for correcting for changes to both connecting and metal trace parasitic capacitive coupling is provided below:

$$Rc_{kj} = R_{kj} - \sum_{i=0}^{i=k-1} C_{ij}R_{ij} - Cr_{kj}\sum_{i!=k}^{all\ rows} R_{ij}$$

where $j = 0,9$.

Note that the above expression is merely exemplary in nature; other expressions may also be used for calculating corrected signals in accordance with embodiments of the present invention. Additionally, the particular expression utilized in a given situation may depend in part upon the particular layout, routing, and/or electrode geometry utilized in the touch sensor panel.

In the above expression, j is the selected sense column, $Rc_{kj}$ is the corrected row signal, $R_{kj}$ is the measured row signal at row k, and each term of the first summation is the amount of capacitance attributable to a particular row servicing a touch region in the path of the drive route of row k. Hence, the portion of the expression that includes the first summation is adapted to address the unwanted changes to connecting trace parasitic capacitive coupling.

Likewise, the second portion of the expression is adapted to address unwanted changes to metal trace parasitic capacitive coupling. In this respect, $Cr_{kj}$ represents a correctional coefficient associated with metal coupling correction at column j. Since the metal trace parasitic capacitive coupling only affects columns 0 and 9 in the particular layout described, this term will only be present in calculations associated with those columns. Note, however, that in embodiments where a different set of pixels is affected by changes to the metal trace parasitic capacitive coupling, the possible range for j can be correspondingly adjusted.

Since the correctional coefficients $Cr_{kj}$ are initially unknown, these values may be calculated by estimating the signal which would be present in affected rows absent any changes to metal trace parasitic capacitive coupling. As stated above, these values may be interpolated or taken from a fitting function as illustrated by FIG. 9.

Once the correctional coefficients $Cr_{kj}$ are calculated, these values may then be used to calculate corrected signals from an input set of measured signals. One or more correction modules may provide such corrections based upon the calculated correctional coefficients. These modules may include any combination of software, firmware, and/or hardware.

Figure 10:
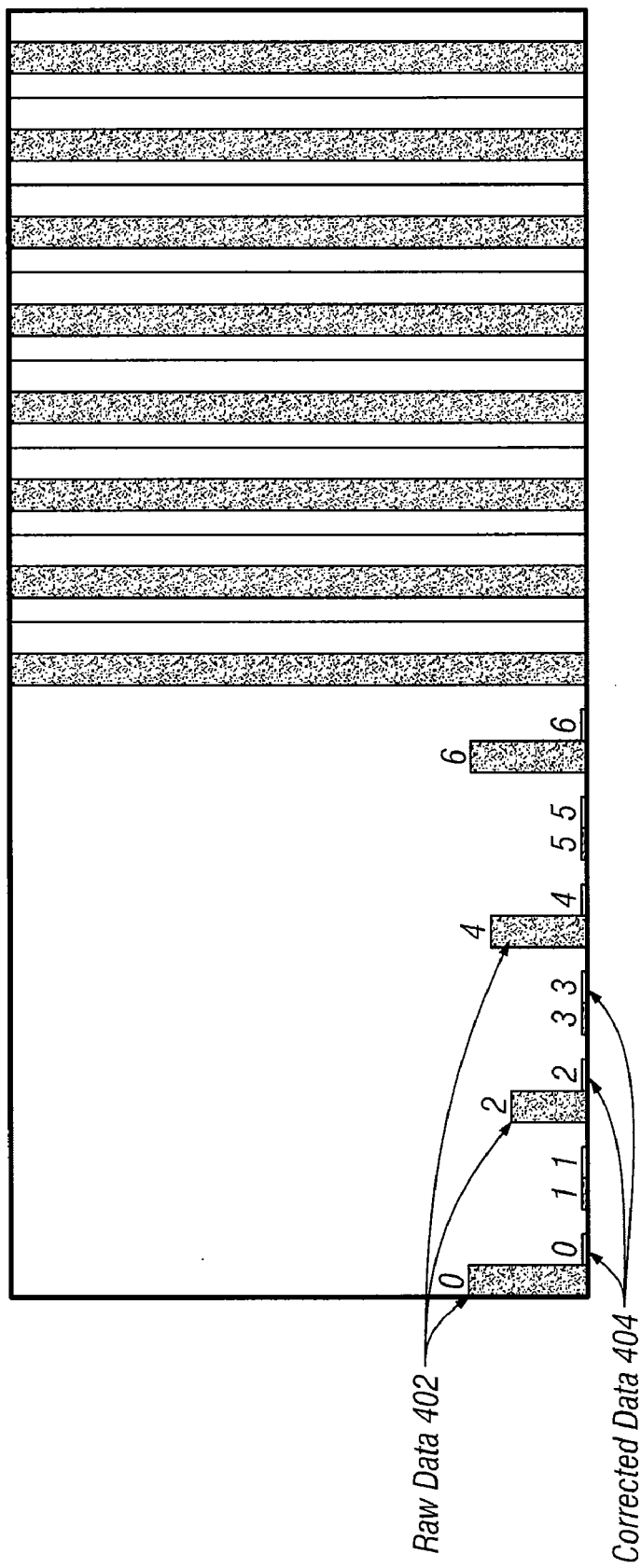
FIG. 10 is a bar chart illustrating exemplary metal capacitive coupling correction of pixel data for rows 0, 2, 4 and 6 in the exemplary touch sensor panel of FIG. 1A according to one embodiment of the present invention.

FIG. 10 is a bar chart illustrating exemplary metal capacitive coupling correction of pixel data for rows 0, 2, 4 and 6 in the exemplary touch sensor panel of FIG. 1A according to one embodiment of the present invention. In this figure, a conductive rubber sheet is covering rows 8-14 of the touch sensor panel. Notice, however, that spurious signals are produced in rows 0, 2, 4, and 6.

Upon applying the correction logic, however, the spurious signals produced in each of these rows are corrected accordingly. In this manner, the effects of unintended changes to the parasitic capacitive coupling associated with metal traces can be mitigated and/or eliminated according to various embodiments of the present invention.

Figure 11:
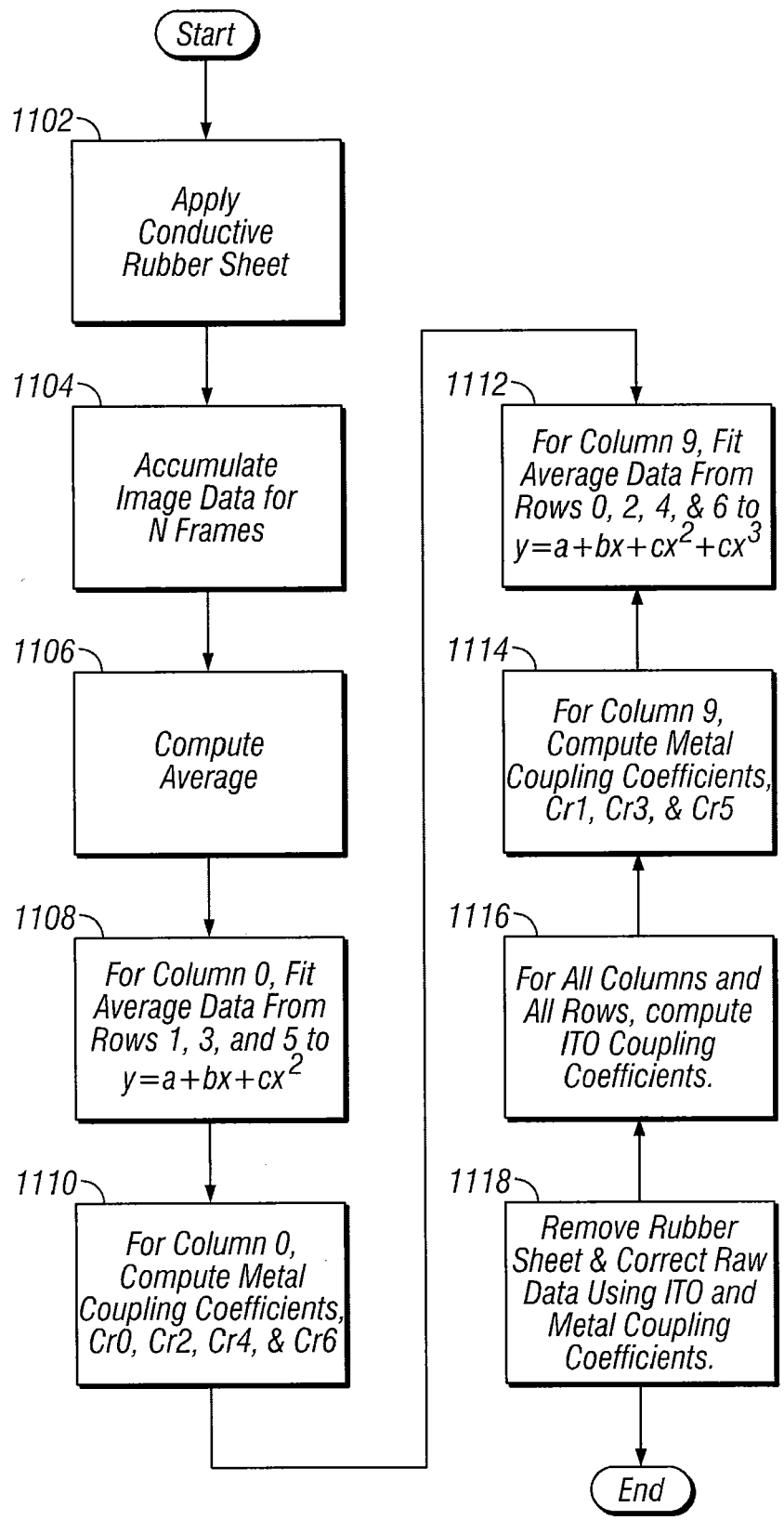
FIG. 11 is a flow diagram illustrating an exemplary process of computing both metal and connecting trace correctional coefficients according to one embodiment of the present invention.

FIG. 11 is a flow diagram illustrating an exemplary process of computing both metal and connecting trace correctional coefficients according to one embodiment of the present invention. At block 1102, a conductive sheet is applied to the touch surface. In some embodiments, the conductive sheet may include a rubber sheet; however, this is not strictly necessary according to embodiments of the present invention. Once the conductive sheet is applied to the touch surface, image data is accumulated for N frames at block 1104, and the average is computed at block 1006.

For column 0, the average data from rows 1, 3, and 5 is then fitted to the equation $y=a+bx+cx^2$ at block 1108. In this manner, the values expected in the absence of changes to metal trace parasitic capacitive coupling at the affected rows can be estimated. Next, the metal coupling coefficients $Cr_0$, $Cr_2$, $Cr_4$, and $Cr_6$ may be calculated using these values along with the image data generated at block 1104.

The metal coupling coefficients for column 9 may then be calculated in a similar manner. At block 1112, the average data from rows 0, 2, 4 and 6 are fit to $y=a+bx+cx^2+cx^3$. Next, the metal coupling coefficients $Cr_1$, $Cr_3$, and $Cr_5$ are calculated at block 1114. These values may be calculated based upon the accumulated image data and the fitted values for the affected rows.

Next, connecting trace coupling coefficients are calculated for all columns and all rows at block 1116. In some embodiments, this may be accomplished by equalizing touch values across all rows serviced by a particular column, taking the corrected data in each row to equal the raw data measured from the row having the shortest connecting trace route among all other rows. Once the connecting trace coupling coefficients have been calculated, the rubber sheet is removed and the coefficients may then be used to correct raw data. This is shown in block 1118.

Figure 12:
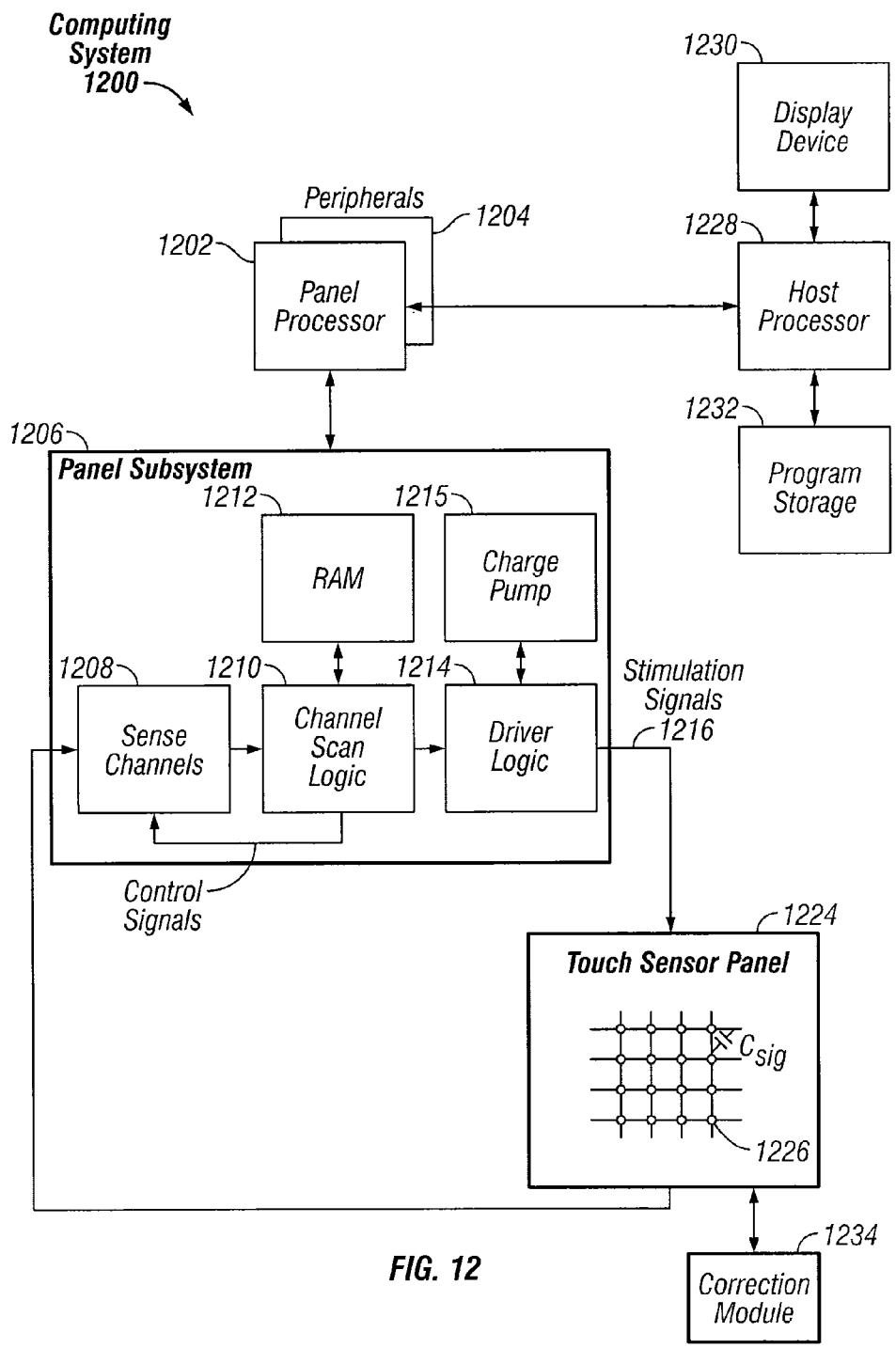
FIG. 12 is a block diagram illustrating an exemplary computing system including a correction module according to one embodiment of the present invention.

FIG. 12 is a block diagram illustrating an exemplary computing system 1200 that can include one or more of the embodiments of the invention described above. Computing system 1200 can include one or more panel processors 1202 and peripherals 1204, and panel subsystem 1206. Peripherals 1204 can include, but are not limited to, random access memory (RAM) or other types of memory or storage, watchdog timers and the like. Panel subsystem 1206 can include, but is not limited to, one or more sense channels 1208, channel scan logic 1210 and driver logic 1214. Channel scan logic 1210 can access RAM 1212, autonomously read data from the sense channels and provide control for the sense channels. In addition, channel scan logic 1210 can control driver logic 1214 to generate stimulation signals 1216 at various frequencies and phases that can be selectively applied to drive lines of touch sensor panel 1224. In some embodiments, panel subsystem 1206, panel processor 1202 and peripherals 1204 can be integrated into a single application specific integrated circuit (ASIC).

Touch sensor panel 1224 can include a capacitive sensing medium having a plurality of drive lines and a plurality of sense lines, although other sensing media can also be used. Each intersection of drive and sense lines can represent a capacitive sensing node and can be viewed as picture element (pixel) 1226, which can be particularly useful when touch sensor panel 1224 is viewed as capturing an "image" of touch. (In other words, after panel subsystem 1206 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 1224 can drive sense channel 1208 (also referred to herein as an event detection and demodulation circuit) in panel subsystem 1206.

Correction module 1234 includes logic adapted to correct the effects of unwanted changes to parasitic capacitive coupling. In some embodiments, correction module 1234 includes a set of metal and ITO coupling coefficients adapted to enable calculation of one or more corrected signals $Rc_{kj}$ from an input set of measured signals $R_{ij}$. Note also that correction module 1234 may include any combination of software, firmware, and/or hardware. Additionally, all or a portion of correction module 1234 may be disposed within the touch sensor panel 1224, the panel subsystem 1206, and/or one or more remote modules.

Computing system 1200 can also include host processor 1228 for receiving outputs from panel processor 1202 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 1228 can also perform additional functions that may not be related to panel processing, and can be coupled to program storage 1232 and display device 1230 such as an LCD display for providing a UI to a user of the device. Display device 1230 together with touch sensor panel 1224, when located partially or entirely under the touch sensor panel, can form touch screen 1218.

Note that one or more of the functions described above can be performed by firmware stored in memory (e.g. one of the peripherals 1204 in FIG. 12) and executed by panel processor 1202, or stored in program storage 1232 and executed by host processor 1228. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 13A:
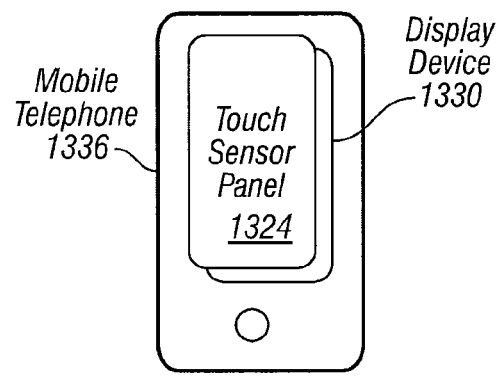
FIG. 13A is a block diagram illustrating an exemplary mobile telephone having a touch sensor panel including a correction module according to one embodiment of the present invention.

FIG. 13A is a block diagram illustrating an exemplary mobile telephone 1336 that can include touch sensor panel 1324 and display device 1330, the touch sensor panel including a correction module according to one embodiment of the present invention.

Figure 13B:
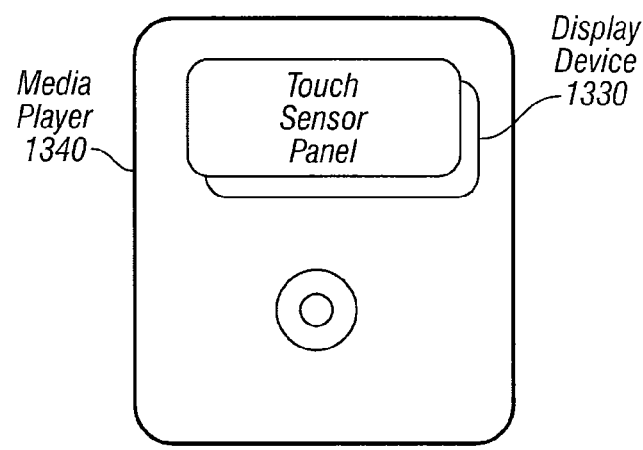
FIG. 13B is a block diagram illustrating an exemplary digital media player having a touch sensor panel including a correction module according to one embodiment of the present invention.

FIG. 13B illustrates exemplary digital media player 1340 that can include touch sensor panel 1324 and display device 1330, the touch sensor panel including a correction module according to one embodiment of the present invention.

Figure 13C:
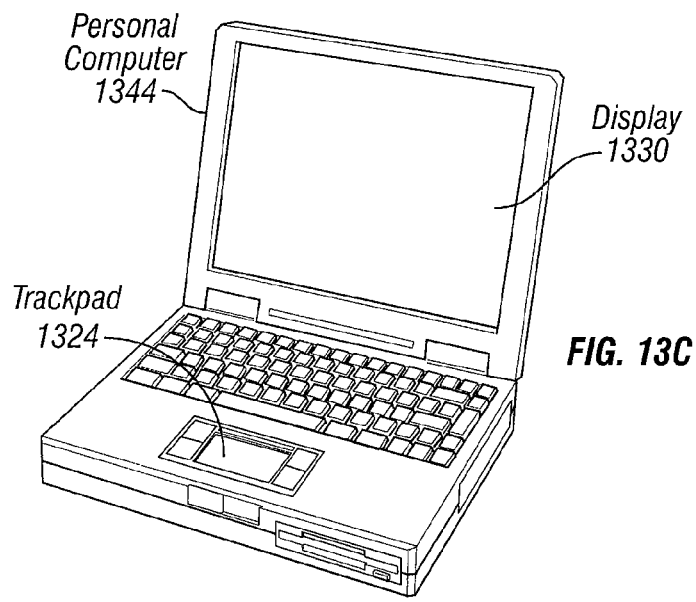
FIG. 13C is a block diagram illustrating an exemplary personal computer having a touch sensor panel including a correction module according to one embodiment of the present invention.

FIG. 13C illustrates exemplary personal computer 1344 that can include touch sensor panel (trackpad) 1324 and display 1330, the touch sensor panel and/or display of the personal computer (in embodiments where the display is part of a touch screen) including a correction module according to one embodiment of the present invention. The mobile telephone, media player and personal computer of FIGS. 13A, 13B and 13C can achieve improved input detection according to embodiments of the invention.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A method of normalizing the effects of parasitic coupling in a touch sensor panel, the method comprising:
    stimulating a drive structure with at least one drive signal, the drive structure comprises one of a plurality of drive lines on the touch sensor panel, each drive line comprising a plurality of drive line conductive elements, the drive line conductive elements being coupled together by a plurality of connecting traces, the connecting traces extend parallel to a plurality of sense lines and disposed between the plurality of sense lines and the plurality of drive line conductive elements;
    detecting at least one sense signal at one or more of the plurality of sense lines on the touch sensor panel, each sense line comprising at least one sense line conductive element, the plurality of sense lines being disposed transverse to the plurality of drive lines;
    correcting the magnitude of the at least one sense signal by utilizing a set of correctional coefficients, wherein the set of correctional coefficients is based at least in part upon a set of previously detected sense signals to provide at least one corrected sense signal; and
    determining a touch position based on the at least one drive signal and the at least one corrected sense signal; and
    wherein the set of previously sensed signals is determined by:
    positioning a conductive element upon the touch sensor panel;
    stimulating a plurality of drive structures; and
    sensing a signal for each drive structure stimulated.

2. The method of claim 1, wherein said positioning a conductive element upon the touch sensor panel comprises completely covering the touch sensor panel with the conductive element.

3. The method of claim 1, wherein the conductive element comprises a conductive rubber sheet.

4. The method of claim 1, wherein the conductive element comprises an electrically active cover.

5. The method of claim 1, wherein the set of correctional coefficients is based at least in part upon an expected signal.

6. The method of claim 5, wherein the set of correctional coefficients is adapted to correct for changes to parasitic capacitive coupling associated with one or more connecting traces coupled to the plurality of drive structures.

7. The method of claim 6, wherein the expected signal is set to be equal to a first signal from the set of previously sensed signals.

8. The method of claim 7, wherein the first signal is obtained from a drive structure having a shorter connecting trace than any other drive structure of a first set of drive structures.

9. The method of claim 5, wherein the set of correctional coefficients is adapted to correct for changes to parasitic capacitive coupling associated with one or more metal traces coupled to the plurality of drive structures.

10. The method of claim 9, wherein the expected signal is determined from a function adapted to fit at least two signals from the set of previously sensed signals.

11. The method of claim 10, wherein said at least two signals comprise signals obtained from drive structures which do not generate parasitic coupling with said one or more metal traces.

12. The method of claim 10, wherein the function comprises a polynomial function.

13. The method of claim 12, wherein the function comprises a polynomial function of an order smaller than the number of said at least two signals.

14. A touch sensor apparatus having a touch sensor panel, the apparatus adapted to normalize the effects of parasitic coupling in the touch sensor panel, the apparatus comprising:
 a drive structure comprises one of a plurality of drive lines on the touch sensor panel, each drive line comprising a plurality of drive line conductive elements, the drive line conductive elements being coupled together by a plurality of connecting traces, the connecting traces extend parallel to a plurality of sense lines and disposed between the plurality of sense lines and the plurality of drive line conductive elements
 one or more of the plurality of sense lines on the touch sensor panel, each sense line comprising at least one sense line conductive element, the plurality of sense lines being disposed transverse to the plurality of drive lines;
 a first module adapted to stimulate a set of drive lines of the plurality of drive lines;
 a second module adapted to sense at least one sense signal on at least one of the plurality of sense lines for each drive line stimulated; and
 a third module adapted to correct the magnitude of the at least one sense signal by utilizing a set of correctional coefficients, wherein at least one correctional coefficient depends upon an expected signal and a set of sensed signals; and
 wherein the set of sensed signals is determined after positioning a conductive element proximate to a sensing portion of the touch sensor panel.

15. The apparatus of claim 14, wherein the set of correctional coefficients is adapted to correct for changes to parasitic capacitive coupling associated with one or more of the plurality of connecting traces.

16. The apparatus of claim 15, wherein the expected signal is set to be equal to a first sensed signal.

17. The apparatus of claim 16, wherein the first sensed signal is obtained from a shorter connecting trace than any other connecting trace in a group of conductive elements extending parallel to the sense lines.

18. The apparatus of claim 14, wherein the set of correctional coefficients is adapted to correct for changes to parasitic capacitive coupling associated with one or more metal traces coupled to the plurality of connecting traces.

19. The apparatus of claim 18, wherein the expected signal is determined by interpolating a plurality of sensed signals from the set of sensed signals.

20. The apparatus of claim 18, wherein the expected signal is derived from a function adapted to fit a plurality of sensed signals from the set of sensed signals.

21. The apparatus of claim 20, wherein the function comprises a second-order fit polynomial function.

22. The apparatus of claim 20, wherein the function comprises a third-order fit polynomial function.

23. A mobile phone comprising a touch sensor panel, the mobile phone adapted to normalize the effects of parasitic coupling, the mobile phone comprising:
 a drive structure comprises one of a plurality of drive lines on the touch sensor panel, each drive line comprising a plurality of drive line conductive elements, the drive line conductive elements being coupled together by a plurality of connecting traces, the connecting traces extend parallel to a plurality of sense lines and disposed between the plurality of sense lines and the plurality of drive line conductive elements
 one or more of the plurality of sense lines on the touch sensor panel, each sense line comprising at least one sense line conductive element, the plurality of sense lines being disposed transverse to the plurality of drive lines;
 a first module adapted to stimulate a set of drive lines of the plurality of drive lines;
 a second module adapted to sense at least one sense signal on at least one of the plurality of sense lines for each drive lines stimulated; and
 a third module adapted to correct the magnitude of a signal by utilizing a set of correctional coefficients, wherein at least one correctional coefficient depends upon an expected signal and a set of sensed signal; and
 wherein the set of sensed signals is determined after positioning a conductive element proximate to a sensing portion of the touch sensor panel.

24. A digital media player comprising a touch sensor panel, the digital media player adapted to normalize the effects of parasitic coupling, the digital media player comprising:
 a drive structure comprises one of a plurality of drive lines on the touch sensor panel, each drive line comprising a plurality of drive line conductive elements, the drive line conductive elements being coupled together by a plurality of connecting traces, the connecting traces extend parallel to a plurality of sense lines and disposed between the plurality of sense lines and the plurality of drive line conductive elements
 one or more of the plurality of sense lines on the touch sensor panel, each sense line comprising at least one sense line conductive element, the plurality of sense lines being disposed transverse to the plurality of drive lines;
 a first module adapted to stimulate a set of drive lines of the plurality of drive lines;
 a second module adapted to sense at least one sense signal on at least one of the plurality of sense lines for each drive lines stimulated; and a third module adapted to correct the magnitude of a signal by utilizing a set of correctional coefficients, wherein at least one correctional coefficient depends upon an expected signal and a set of sensed signals; and wherein the set of sensed signals is determined after positioning a conductive element proximate to a sensing portion of the touch sensor panel.

25. A personal computer comprising a touch sensor panel, the personal computer adapted to normalize the effects of parasitic coupling, the personal computer comprising:

a drive structure comprises one of a plurality of drive lines on the touch sensor panel, each drive line comprising a plurality of drive line conductive elements, the drive line conductive elements being coupled together by a plurality of connecting traces, the connecting traces extend parallel to a plurality of sense lines and disposed between the plurality of sense lines and the plurality of drive line conductive elements one or more of the plurality of sense lines on the touch sensor panel, each sense line comprising at least one sense line conductive element, the plurality of sense lines being disposed transverse to the plurality of drive lines;

a first module adapted to stimulate a set of drive lines of the plurality of drive lines;

a second module adapted to sense at least one sense signal on at least one of the plurality of sense lines for each drive structure stimulated; and a third module adapted to correct the magnitude of the at least one sense signal by utilizing a set of correctional coefficients, wherein at least one correctional coefficient depends upon an expected signal and a set of sensed signals; and wherein the set of sensed signals is determined after positioning a conductive element proximate to a sensing portion of the touch sensor panel.

26. The method of claim 1, wherein:

one or more metal traces are disposed in a border area of the touch sensor panel and are coupled to the plurality of drive lines, whereby the one or more metal traces exhibit parasitic capacitive coupling to one or more of the plurality of sense lines.

27. The method of claim 26, wherein:

the plurality of drive line conductive elements form a matrix on the touch sensor panel, and a first set of drive line conductive elements in a first direction comprise the plurality of drive lines, and a second set of drive line conductive elements in a second direction comprise columns of drive line conductive elements disposed between adjacent sense lines.

28. A method of normalizing the effects of parasitic coupling in a touch sensor panel, the method comprising:

stimulating a drive structure;

detecting a signal at a sense structure in response to stimulating the drive structure; and correcting the signal by utilizing a set of correctional coefficients, wherein the set of correctional coefficients is based at least in part upon a set of previously sensed signals, wherein the set of previously sensed signals is determined by a process comprising:

completely covering the touch sensor panel with a conductive element;

stimulating a plurality of drive structures; and sensing a signal for each drive structure stimulated.

29. The method of claim 28, wherein the conductive element comprises a conductive rubber sheet.

30. The method of claim 28, wherein the conductive element comprises an electrically active cover.

31. The method of claim 28, wherein the set of correctional coefficients is based at least in part upon an expected signal.

32. The method of claim 31, wherein the set of correctional coefficients is adapted to correct for changes to parasitic capacitive coupling associated with one or more connecting traces coupled to the plurality of drive structures.

33. The method of claim 32, wherein the expected signal is set to be equal to a first signal from the set of previously sensed signals.

34. The method of claim 33, wherein the first signal is obtained from a drive structure having a shorter connecting trace than any other drive structure of a first set of drive structures.

35. The method of claim 31, wherein the set of correctional coefficients is adapted to correct for changes to parasitic capacitive coupling associated with one or more metal traces coupled to the plurality of drive structures.

36. The method of claim 35, wherein the expected signal is determined from a function adapted to fit at least two signals from the set of previously sensed signals.

37. The method of claim 36, wherein said at least two signals comprise signals obtained from drive structures which do not generate parasitic coupling with said one or more metal traces.

38. The method of claim 36, wherein the function comprises a polynomial function.

39. The method of claim 38, wherein the function comprises a polynomial function of an order smaller than the number of said at least two signals.

40. A method of normalizing the effects of parasitic coupling in a touch sensor panel, the method comprising:

stimulating a drive structure;

detecting a signal at a sense structure in response to stimulating the drive structure; and correcting the signal by utilizing a set of correctional coefficients, wherein the set of correctional coefficients is based at least in part upon a set of previously sensed signals wherein the set of previously sensed signals is determined by a process comprising:

completely covering a conductive element upon the touch sensor panel;

stimulating a plurality of drive structures; and sensing a signal for each drive structure stimulated.

41. An apparatus adapted to normalize the effects of parasitic coupling, the apparatus comprising:

a memory unit adapted to store data;

a first module adapted to stimulate a set of drive structures;

a second module adapted to sense a signal for each drive structure stimulated; and a third module adapted to correct a signal by utilizing a set of correctional coefficients, wherein at least one correctional coefficient depends upon an expected signal and a set of sensed signals;

wherein:

the set of correctional coefficients is adapted to correct for changes to parasitic capacitive coupling associated with one or more connecting traces coupled to the set of drive structures; and the expected signal is set to be equal to a first sensed signal; and wherein the first sensed signal is obtained from a drive structure having a shorter connecting trace than any other drive structure of the set of drive structures.

42. An apparatus adapted to normalize the effects of parasitic coupling, the apparatus comprising:
  a memory unit adapted to store data;
  a first module adapted to stimulate a set of drive structures;
  a second module adapted to sense a signal for each drive structure stimulated; and
  a third module adapted to correct a signal by utilizing a set of correctional coefficients, wherein at least one correctional coefficient depends upon an expected signal and a set of sensed signals;

wherein:
  the set of correctional coefficients is adapted to correct for changes to parasitic capacitive coupling associated with one or more metal traces coupled to the set of drive structures;
  the expected signal is derived from a function adapted to fit a plurality of sensed signals from the set of sensed signals; and
  the function comprises a third-order fit polynomial function.

* * * * *